(12) United States Patent
Ma et al.

(10) Patent No.: US 11,646,324 B2
(45) Date of Patent: May 9, 2023

(54) DISPLAY PANEL AND DISPLAY DEVICE

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Yongda Ma, Beijing (CN); Yong Qiao, Beijing (CN); Jianbo Xian, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 371 days.

(21) Appl. No.: 17/126,719

(22) Filed: Dec. 18, 2020

(65) Prior Publication Data

US 2021/0193690 A1 Jun. 24, 2021

(30) Foreign Application Priority Data

Dec. 20, 2019 (CN) .......................... 201922309918.5

(51) Int. Cl.
*H01L 27/12* (2006.01)
*H01L 29/786* (2006.01)

(52) U.S. Cl.
CPC ...... *H01L 27/124* (2013.01); *H01L 29/78696* (2013.01)

(58) Field of Classification Search
CPC ............. H01L 27/124; H01L 29/78696; G02F 1/136286
See application file for complete search history.

(56) References Cited

U.S. PATENT DOCUMENTS

2009/0135103 A1* 5/2009 Kim ..................... H10K 59/131
345/76

FOREIGN PATENT DOCUMENTS

KR 20080060529 A * 7/2008 ....... G02F 1/136286

* cited by examiner

*Primary Examiner* — Peter M Albrecht
(74) *Attorney, Agent, or Firm* — Dority & Manning, P.A.

(57) ABSTRACT

A display panel includes first signal lines, second signal lines, first conductive patterns, second conductive patterns, at least one first switching unit and at least one second switching unit. An area of the first signal line is greater than that of the second signal line. Each first signal line is electrically connected to at least one first conductive pattern through at least one first switching unit. Each second signal line is electrically connected to at least one second conductive pattern through at least one second switching unit. The first switching unit includes at least one first thin film transistor, and the second switching unit includes at least one second thin film transistor. A channel width-to-length ratio of each first thin film transistor is greater than that of each second thin film transistor.

18 Claims, 26 Drawing Sheets

DISPLAY PANEL AND DISPLAY DEVICE

CROSS-REFERENCE TO RELATED APPLICATION

This application claims priority to Chinese Patent Application No. 201922309918.5, filed on Dec. 20, 2019, which is incorporated herein by reference in its entirety.

TECHNICAL FIELD

The present disclosure relates to the field of display technologies, and in particular, to a display panel and a display device.

BACKGROUND

In a display panel, various signal lines can provide signals to support display of the display panel. The signal lines include a plurality of data lines and a plurality of gate lines. The gate lines are used for providing scan signals for sub-pixels of the display panel, and the data lines are used for providing data signals for the sub-pixels, so as to make the sub-pixels emit light and make the display panel display images.

SUMMARY

In an aspect, a display panel is provided. The display panel includes a plurality of first signal lines, a plurality of second signal lines, at least one first conductive pattern, at least one second conductive pattern, a plurality of first switching units and a plurality of second switching units, an area of each first signal line being greater than an area of each second signal line. Each first signal line is electrically connected to at least one first conductive pattern through at least one first switching unit, each first switching unit is configured to close a line between a corresponding first signal line and a corresponding first conductive pattern, the first switching unit includes at least one first thin film transistor. Each second signal line is electrically connected to at least one second conductive pattern through at least one first switching unit, each second switching unit is configured to close on a line between a corresponding second signal line and a corresponding second conductive pattern, and the second switching unit includes at least one second thin film transistor. A channel width-to-length ratio of each first thin film transistor is greater than a channel width-to-length ratio of each second thin film transistor.

In some embodiments, the first switching unit includes at least two first thin film transistors; and a number of the at least two first thin film transistors included in the first switching unit is greater than a number of the at least one second thin film transistor included in the second switching unit.

In some embodiments, the first switching unit includes three first thin film transistors, and the second switching unit includes two second thin film transistors.

In some embodiments, the first switching unit includes a plurality of first thin film transistors connected in series, and a channel width-to-length ratio of a first thin film transistor closest to the first signal line is greater than a channel width-to-length ratio of each remaining first thin film transistor; and/or, the second switching unit includes a plurality of second thin film transistors connected in series, and a channel width-to-length ratio of a second thin film transistor closest to the second signal line is greater than a channel width-to-length ratio of each remaining second thin film transistor.

In some embodiments, the first switching unit includes a plurality of first thin film transistors connected in series; a first electrode of a first thin film transistor closest to the corresponding first signal line is electrically connected to the corresponding first signal line, and a second electrode of another first thin film transistor closest to the corresponding first conductive pattern is electrically connected to the corresponding first conductive pattern; and a gate of each first thin film transistor is electrically connected to a first electrode thereof, or is a floating gate. The second switching unit includes a plurality of second thin film transistors connected in series; a first electrode of a second thin film transistor closest to the corresponding second signal line is electrically connected to the corresponding second signal line, and a second electrode of another second thin film transistor closest to the corresponding second conductive pattern is electrically connected to the second corresponding conductive pattern; and a gate of each second thin film transistor is electrically connected to a first electrode thereof, or is a floating gate.

In some embodiments, the gate of each first thin film transistor is electrically connected to the first electrode thereof; and the display panel further comprises a plurality of third switching units, and the first signal line is further electrically connected to the at least one first conductive pattern through at least one third switching unit; each third switching unit is configured to close a line between a corresponding first signal line and a corresponding first conductive pattern. The third switching unit includes a plurality of third thin film transistors connected in series; a first electrode of a third thin film transistor closest to the corresponding first conductive pattern is electrically connected to the corresponding first conductive pattern, and a second electrode of another third thin film transistor closest to the corresponding first signal line is electrically connected to the corresponding first signal line; and a gate of each third thin film transistor is electrically connected to a first electrode thereof.

In some embodiments, a number of the at least one third thin film transistor included in the third switching unit is equal to a number of the at least one first thin film transistor included in the first switching unit, and/or, a channel width-to-length ratio of each third thin film transistor is substantially equal to the channel width-to-length ratio of each first thin film transistor.

In some embodiments, the gate of each second thin film transistor is electrically connected to the first electrode thereof; and the display panel further comprises a plurality of fourth switching units, and the second signal line is further electrically connected to the at least one second conductive pattern through at least one fourth switching unit; each fourth switching unit is configured to close a line between a corresponding second signal line and a corresponding second conductive pattern. The fourth switching unit includes a plurality of fourth thin film transistors connected in series; a first electrode of a fourth thin film transistor closet to the corresponding second conductive pattern is electrically connected to the corresponding second conductive pattern, and a second electrode of another fourth thin film transistor closet to the corresponding second signal line is electrically connected to the corresponding second signal line; and a gate of each fourth thin film transistor is electrically connected to a first electrode thereof.

In some embodiments, a number of the at least one fourth thin film transistor included in the fourth switching unit is equal to a number of the at least one second thin film transistor included in the second switching unit, and/or a channel width-to-length ratio of each fourth thin film transistor is substantially equal to the channel width-to-length ratio of each second thin film transistor.

In some embodiments, the display panel further includes a common electrode line. The at least one first conductive pattern and the at least one second conductive pattern are electrically connected to the common electrode line.

In some embodiments, the display panel further includes a plurality of fifth switching units and a plurality of sixth switching units. The corresponding first conductive pattern is electrically connected to the common electrode line through at least one fifth switching unit. The fifth switching unit includes a plurality of fifth thin film transistors connected in series; a first electrode of a fifth thin film transistor closet to the corresponding first conductive pattern is electrically connected to the corresponding first conductive pattern, and a second electrode of another fifth thin film transistor closet to the common electrode line is electrically connected to the common electrode line; and a gate of each fifth thin film transistor is electrically connected to a first electrode thereof. The corresponding second conductive pattern is electrically connected to the common electrode line through at least one sixth switching unit. The sixth switching unit includes at least one sixth thin film transistor, and the at least one sixth thin film transistor includes a plurality of sixth thin film transistors connected in series; a first electrode of a sixth thin film transistor closet to the corresponding second conductive pattern is electrically connected to the corresponding second conductive pattern, and a second electrode of another sixth thin film transistor closet to the common electrode line is electrically connected to the common electrode line; and a gate of each sixth thin film transistor is electrically connected to a first electrode thereof.

In some embodiments, a number of at least one fifth thin film transistor included in the fifth switching unit is equal to a number of the at least one first thin film transistor included in the first switching unit; and/or a number of at least one sixth thin film transistor included in the sixth switching unit is equal to a number of the at least one second thin film transistor included in the second switching unit.

In some embodiments, a channel width-to-length ratio of each fifth thin film transistor is substantially equal to the channel width-to-length ratio of each first thin film transistor and/or, a channel width-to-length ratio of each sixth thin film transistor is substantially equal to the channel width-to-length ratio of each second thin film transistor.

In some embodiments, a channel width-to-length ratio of each fifth thin film transistor is substantially equal to a channel width-to-length ratio of each sixth thin film transistor.

In some embodiments, the at least one first conductive pattern includes one first conductive pattern, and the at least one second conductive pattern includes one second conductive pattern. The first signal line is electrically connected to the one first conductive pattern through one first switching unit, and the second signal line is electrically connected to the one second conductive pattern through one second switching unit.

In some embodiments, the at least one first conductive pattern includes two first conductive patterns arranged at two opposite sides of the plurality of first signal lines, and the at least one second conductive pattern includes two second conductive patterns arranged at two opposite sides of the plurality of second signal lines. The first signal line is electrically connected to the two first conductive patterns through two first switching units, respectively; and/or the second signal line is electrically connected to the two second conductive patterns through two second switching units, respectively.

In some embodiments, the first signal lines are gate lines, and the second signal lines are data lines In some embodiments, an active layer of each first thin film transistor is provided with a first opening; and a length of the first opening is less than a length of an orthographic projection of a gate of the first thin film transistor on a plane where the active layer of the first thin film transistor is located, and a width of the first opening is less than a width of the orthographic projection of the gate of the first thin film transistor on the plane where the active layer of the first thin film transistor is located; and/or an active layer of each second thin film transistor is provided with a second opening, a length of the second opening is less than a length of an orthographic projection of a gate of the second thin film transistor on a plane where the active layer of the second thin film transistor is located, and a width of the second opening is less than a width of the orthographic projection of the gate of the second thin film transistor on the plane where the active layer of the second thin film transistor is located.

In another aspect, a display device is provided. The display device includes the display panel as described above.

BRIEF DESCRIPTION OF THE DRAWINGS

In order to describe technical solutions in embodiments of the present disclosure more clearly, the accompanying drawings to be used in the description of embodiments will be introduced briefly. However, the accompanying drawings to be described below are merely accompanying drawings of some embodiments of the present disclosure, and a person of ordinary skill in the art can obtain other drawings according to those drawings without paying any creative effort.

DETAILED DESCRIPTION

Figure 1A:
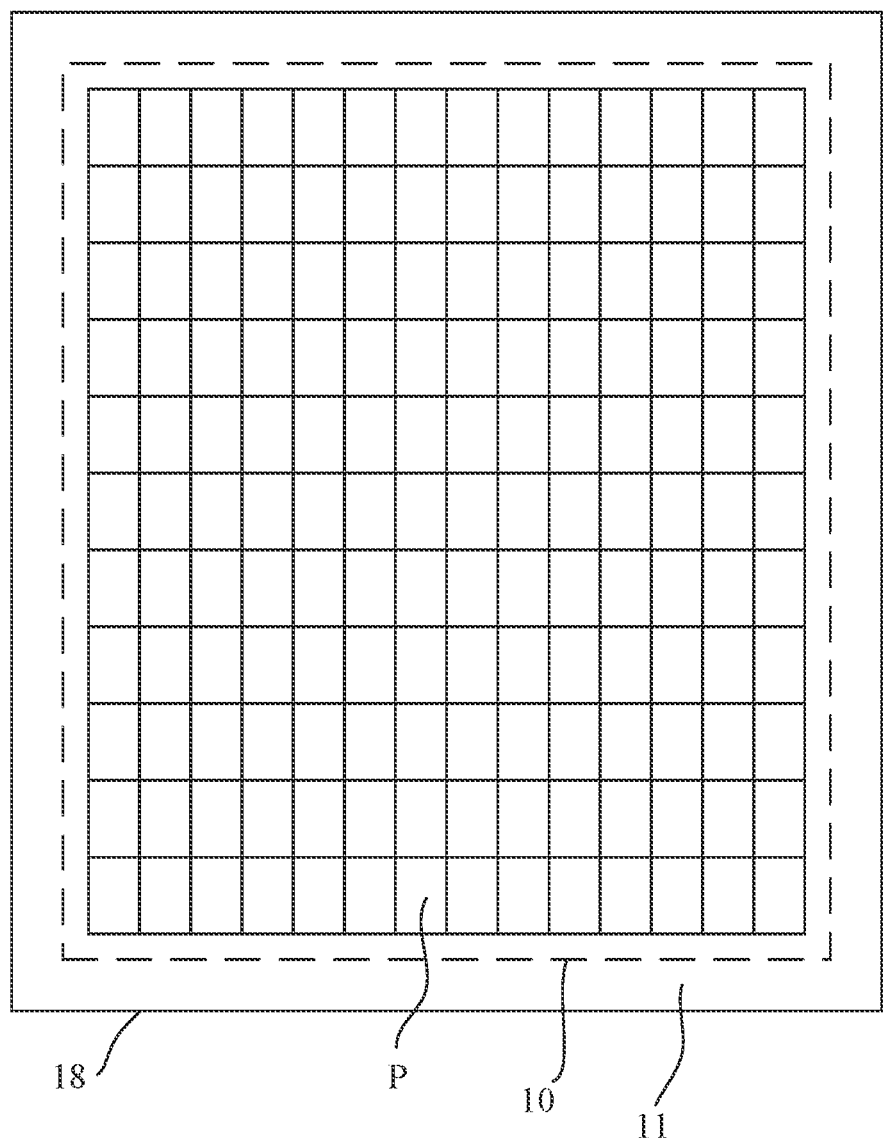
FIG. 1A is a schematic top view of a display panel, in accordance with some embodiments.

Technical solutions in some embodiments of the present disclosure will be described dearly and completely in combination with the accompanying drawings in some embodiments of the present disclosure. However, the described embodiments are merely some but not all embodiments of the present disclosure. All other embodiments obtained on a basis of the embodiments of the present disclosure by a person of ordinary skill in the art without paying any creative effort shall be included in the protection scope of the present disclosure.

Unless the context requires otherwise, throughout the description and claims, the term "comprise" and other forms thereof such as the third-person singular form "comprises" and the present participle form "comprising" are construed as an open and inclusive meaning, i.e., "included, but not limited to". In the description of the specification, terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments/examples in any suitable manner.

Terms such as "first" and "second" are only used for descriptive purposes, and are not to be construed as indicating or implying the relative importance or implicitly indicating the number of indicated technical features below. Thus, features defined by "first" and "second" may explicitly or implicitly include one or more of the features. In the description of the embodiments of the present disclosure, the term "a plurality of/the plurality of" means two or more unless otherwise specified.

In the description of some embodiments, terms such as "connected" and their extensions may be used. For example, the term "connected" may be used in the description of some embodiments to indicate that two or more components are in direct physical or electrical contact with each other. However, the term "connected" may also mean that two or more elements are not in direct contact with each other, but still cooperate or interact with each other. The embodiments disclosed herein are not necessarily limited to the contents herein.

It will also be understood that when a layer or element is referred to as being "on" another layer or substrate, it can be directly on the other layer or substrate, or intervening layers may also be present.

The phrase "A and/or B" includes the following three combinations: only A, only B, and a combination of A and B. The phrase "at least one of A, B, and C" has a same meaning as the phrase "at least one of A, B, or C", and both include the following combinations of A, B, and C: only A, only B, only C, a combination of A and B, a combination of A and C, a combination of B and C, and a combination of A, B, and C.

The term "substantially" or "approximately" includes the stated value and the average value that is within an acceptable deviation range of a specific value. The acceptable deviation range is determined by a person of ordinary skill in the art in view of measurement in question and errors associated with measurement of a specific parameter (i.e., limitations of a measurement system).

In a manufacturing process of a display panel, electrostatic charges are easily generated on the display panel. When electrostatic charges accumulate on signal lines and components connected thereto to a certain degree, the electrostatic charges may be discharged between components, which may cause damage to the components. In order to avoid the damage, the signal lines in the display panel are electrically connected to conductive patterns through electrostatic discharge (ESD) protection circuits (e.g., each of which includes at least one thin film transistor). In this way, electrostatic charges on the signal lines and the components may be conducted to the conductive patterns through the ESD protection circuits, and accumulation of the electrostatic charges on the signal lines and the components connected thereto are decreased. Accordingly, a risk of damaging the components in the display panel caused by ESD between components may be reduced.

Since different kinds of signal lines in the display panel may have different lengths and/or widths, the signal lines may have different areas. For example, compared to a data line, a gate line may have a greater area than the data line. In a case where areas of the signal lines are different, amounts of electrostatic charges generated on the signal lines may be different. The larger an area of a signal line is, the more electrostatic charges generated on the signal line are. In other words, different kinds of signal lines may have different demands for discharging the electrostatic charges to the conductive patterns.

In the related art, electrical parameters of the ESD protection circuits electrically connected to the signal lines are substantially the same, which may not meet the ESD demands of signal lines with different areas. For example, when the ESD protection circuits are designed in the related art, a signal line with a smaller area is used as a reference of the ESD demands, which may cause that electrostatic charges on a signal line with a larger area cannot be conducted out of the signal line in time. For another example, a signal line with a larger area is used as a reference of the ESD demands, which may cause that electrostatic charges on a signal line with a smaller area cannot form an electrostatic voltage great enough to turn on the ESD protection circuits and the electrostatic charges may not be conducted out of the signal line in time.

Some embodiments of the present disclosure provide a display device. The display device may be, for example, a liquid crystal display (LCD) device, an organic light-emitting diode (OLED) display device, a micro light-emitting diode (Micro LED) display device, or a mini light-emitting diode (Mini LED) display device. The display device may be any product or component with a display function, such as a monitor, a TV, a digital camera, a mobile phone, or a tablet computer. Since these display devices may have characteristics of good display effect, relatively low manufacturing cost, and the like, they may be widely applied to various places where display is required.

Figure 1B:
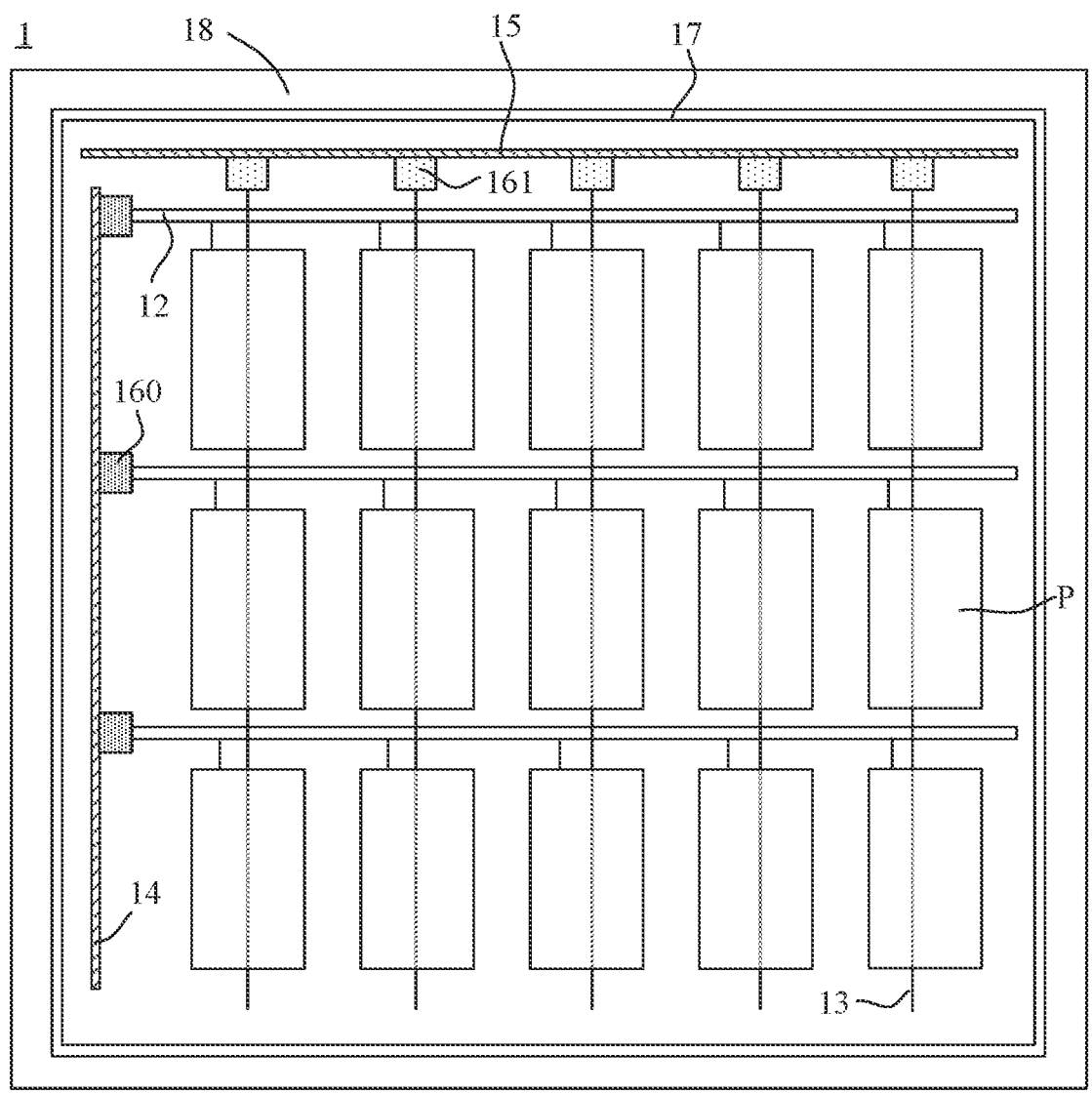
FIG. 1B is a schematic diagram of a display panel, in accordance with some embodiments.
Figure 1C:
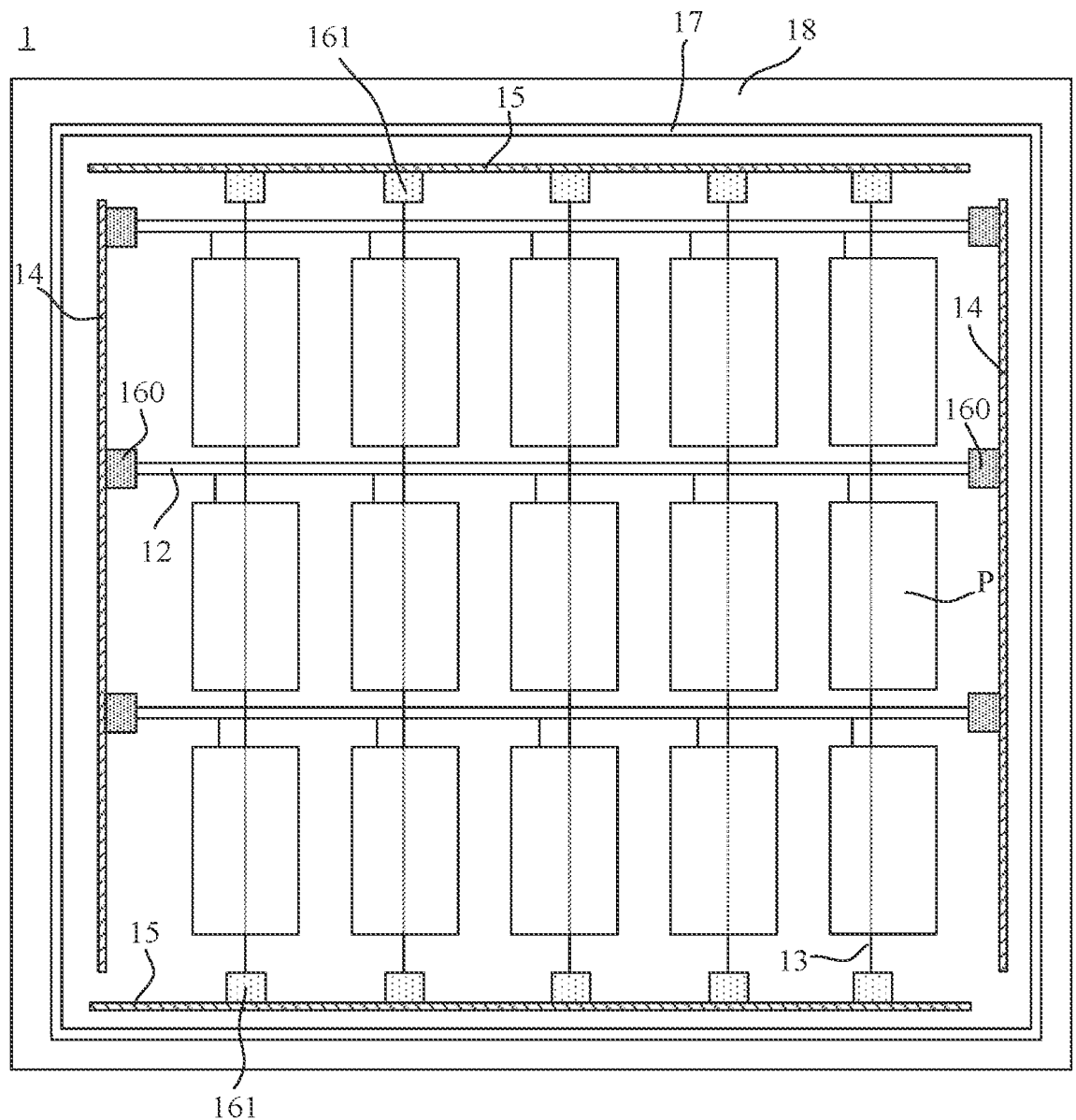
FIG. 1C is a schematic diagram of another display panel, in accordance with some embodiments.

The display device includes at least a display panel. As shown in FIGS. 1A to 1C, the display panel 1 has an active area (AA) 10 and a peripheral area 11. The peripheral area 11 is disposed on at least one side of the active area 10. For example, the peripheral area 11 is disposed around the active area 10.

The display panel 1 includes a substrate 18, and the substrate 18 plays a supporting role. The substrate 18 may be, for example, a substrate on which no layer has been formed, or a substrate on which at least one layer has been formed. For example, the substrate 18 includes a glass base and an inorganic buffer layer formed on the glass base.

The display panel 1 further includes a plurality of first signal lines 12 and a plurality of second signal lines 13 that are disposed on the substrate 18 and located in the active area 10. For example, the first signal lines 12 are gate lines, and the second signal lines 13 are data lines. In another example, the first signal lines 12 are data lines, and the second signal lines 13 are gate lines. Herein, the description is made by taking an example in which the first signal lines 12 are gate lines, and the second signal lines 13 are data lines. Orthographic projections of the gate lines and the data lines on the substrate 18 intersect.

The display panel 1 further includes a plurality of sub-pixels P disposed in the active area 10. FIG. 1A illustrates an example in which the sub-pixels P are arranged in an array. Of course, the sub-pixels P may also be arranged in other ways. The sub-pixels P include at least a first color sub-pixel, a second color sub-pixel and a third color sub-pixel, and the first color, the second color and the third color are three primary colors (e.g., red, green and blue, respectively).

Figure 8:
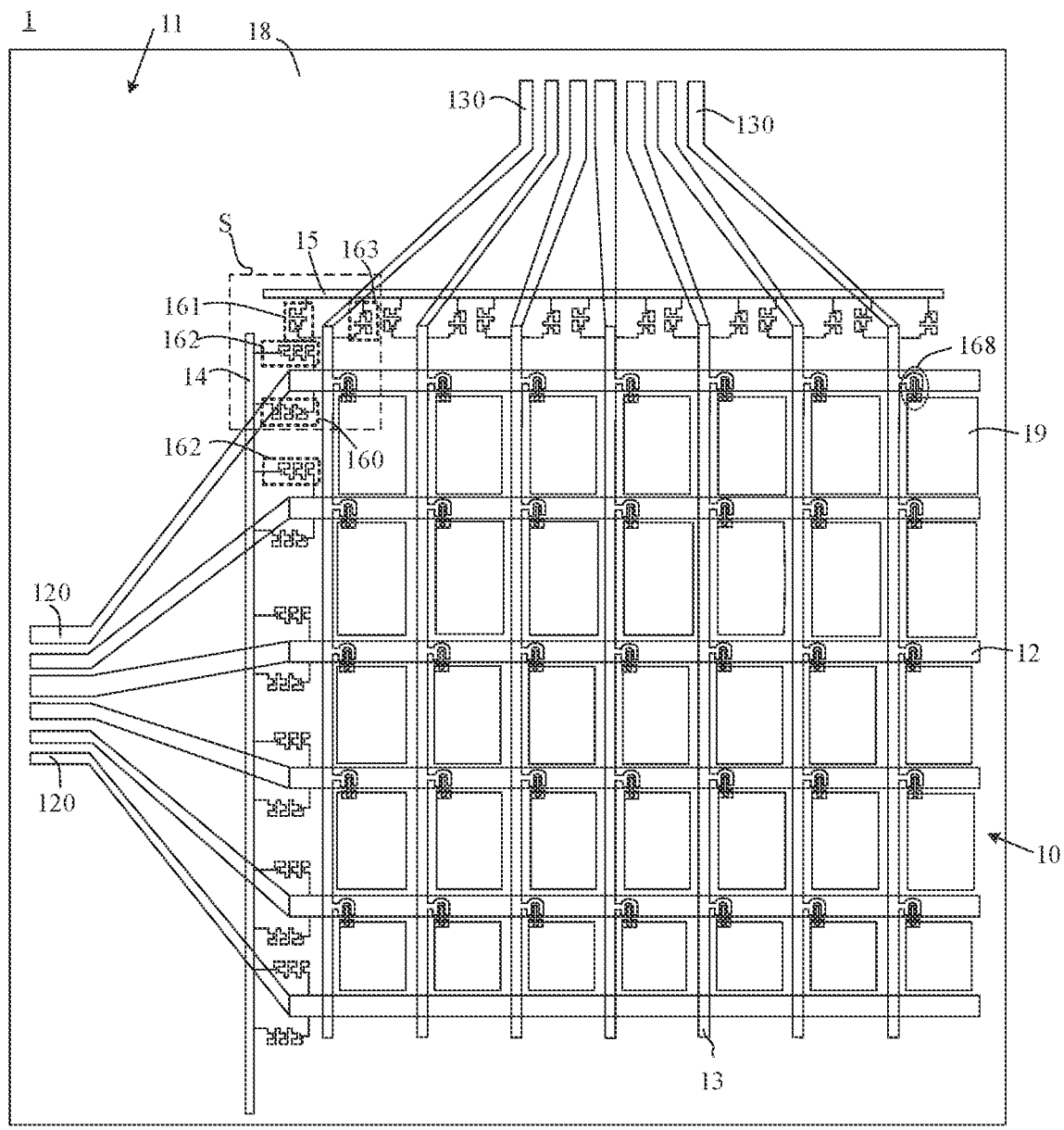
FIG. 8 is a schematic diagram of yet another display panel, in accordance with some embodiments.

For example, referring to FIG. 8, the display panel 1 further includes a plurality of gate line leading-out terminals 120 and a plurality of data line leading-out terminals 130 disposed in the peripheral area 11 of the display panel 1, and a plurality of connection portions each of which is electrically connected between a corresponding gate line and a corresponding gate line leading-out terminal 120, or between a corresponding data line and a corresponding data line leading-out terminal 130. A gate line leading-out terminal 120 and a corresponding connection portion are used for leading a corresponding gate line in the active area 10 to the peripheral area 11 to be electrically connected to control components such as a timing controller and a gate driver. A data line leading-out terminal 130 and a corresponding connection portion are used for leading a corresponding data line in the active area 10 to the peripheral area 11 to be electrically connected to control components such as a source driver. For example, the connection portion may be an inclined connection portion intersecting with a corresponding signal line.

With continued reference to FIG. 8, an area enclosed by orthographic projections of a gate line and a data line that intersect with each other is a sub-pixel area in which a sub-pixel P is located, and the sub-pixel area includes an opening area which is a light-emitting area of the sub-pixel P. The sub-pixel P includes a pixel driver circuit 19, and the pixel driver circuit 19 is electrically connected to the data-line through a thin film transistor 168. The thin film transistor 168 includes a gate, a portion of a gate insulating layer, an active layer, a source and a drain. Each of the source and the drain is in contact with the active layer, and the drain or the source of the thin film transistor 168 is electrically connected to the pixel driver circuit 19.

The first signal line 12 and the second signal line 13 are made from, for example, a material including at least one of cuprum (Cu), molybdenum (Mo), aluminum (Al) or argentum (Ag). The first signal line 12 and the second signal line 13 may be of a single-layer structure or a multi-layer structure, for example, a three-layer structure of MO-Al-MO.

On this basis, in some embodiments, as shown in FIGS. 1B and 1C, the display panel 1 further includes at least one first conductive pattern 14, at least one second conductive pattern 15, a plurality of first switching units 160, and a plurality of second switching units 161, which are all disposed on the substrate 18.

An area of the first signal line 12 is greater than an area of the second signal line 13. It will be noted that, in this case, an amount of electrostatic charges generated on the first signal line 12 may be greater than an amount of electrostatic charges generated on the second signal line 13. Therefore, compared with the second signal line 13, the first signal line 12 may have a greater demand for conducting electrostatic charges to the first conductive pattern 14. For example, electrostatic charges on the first signal line 12 may need to be conducted to the first conductive pattern 14 relatively rapidly to avoid damage to components in the display panel 1 connected to the first signal line 12 due to electrostatic charge accumulation and ESD between the components.

Herein, that an area of a first signal line 12 is greater than an area of a second signal line 13 may have several implementations. For example, a length of the first signal line 12 is greater than a length of the second signal line 13, and a width of the first signal line 12 is greater than a width of the second signal line 13. For another example, the length of the first signal line 12 is greater than the length of the second signal line 13, and the width of the first signal line 12 is equal to the width of the second signal line 13. For yet another example, the length of the first signal line 12 is equal to the length of the second signal line 13, and the width of the first signal line 12 is greater than the width of the second signal line 13.

It will also be noted that, referring to FIG. 8, orthographic projections of the connection portion (which connects the gate line and the gate line leading-out terminal 120) and the first conductive pattern 14 on the substrate 18 have an overlapping area therebetween, and orthographic projections of the connection portion (which connects the data line and the data line leading-out terminal 130) and the second conductive pattern 15 on the substrate 18 have an overlapping area therebetween, but the connection portions are insulated from the first conductive pattern 14 and the second conductive pattern 15. For example, the first conductive pattern 14 may be disposed in a different layer from the gate line leading-out terminal 120 and the first signal line 12, and the second conductive pattern 15 may be disposed in a different layer from the data line leading-out terminal 130 and the second signal line 13.

In some embodiments, referring to FIGS. 1B and 1C, each first signal line 12 is electrically connected to at least one first conductive pattern 14 through at least one first switching unit 160. Each second signal line 13 is electrically connected to at least one second conductive pattern 15 through at least one second switching unit 161. Each first switching unit 160 is configured to close a line between the first signal line 12 and a first conductive pattern 14 when electrostatic charges are generated on the first signal line 12. Each second switching unit 161 is configured to close a line between the second signal line 13 and a second conductive pattern 15 when electrostatic charges are generated on the second signal line 13.

In some examples, referring to FIG. 1B, the at least one first conductive pattern 14 includes one first conductive pattern 14, the plurality of first signal lines 12 are electrically connected to the first conductive pattern 14, and each first signal line 12 is electrically connected to the first conductive pattern 14 through one first switching unit 160. That is, the plurality of first switching units 160 and the plurality of first signal lines 12 are in a one-to-one correspondence.

Of course, the display panel 1 may also include a plurality of first conductive patterns 14 arranged at a side of the active area 10, and each first signal line 12 is electrically connected to a respective one of the first conductive patterns 14 though a respective one of the first switching units 160.

In some other examples, the at least one first conductive pattern 14 includes at least two first conductive patterns 14 disposed at two opposite sides of the active area 10, the plurality of first signal lines 12 are electrically connected to the at least two first conductive patterns 14, and each first signal line 12 is electrically connected to the at least two conductive pattern 14 through at least two first switching units 160, respectively. For example, as shown in FIG. 1C, the at least one first conductive pattern 14 includes two first conductive patterns 14 disposed at two opposite sides of the active area 10, one end of the first signal line 12 is connected to one first conductive pattern 14 through one first switching unit 160, and another end of the first signal line 12 is connected to another first conductive pattern 14 through another first switching unit 160. In another example, the display panel 1 may also include more than two first conductive patterns 14 arranged at two opposite sides of the active area 10, and each first signal line 12 is electrically connected to corresponding two of the first conductive patterns 14 though corresponding two of the first switching units 160, respectively.

Similarly, in some examples, referring to FIG. 1B, the at least one second conductive pattern 15 includes one second conductive pattern 15, the plurality of second signals 13 are electrically connected to the second conductive pattern 15, and each second signal line 13 is electrically connected to the second conductive pattern 15 through one second switching unit 161.

In some other examples, the at least one second conductive pattern 15 includes at least two second conductive patterns 15 disposed at two opposite sides of the active area 10, the plurality of second signals 13 are electrically connected to the at least two second conductive patterns 15, and each second signal line 13 is electrically connected to the at least two second conductive patterns 15 through at least two second switching units 161, respectively. For example, referring to FIG. 1C, the at least one second conductive pattern 15 includes two second conductive patterns 15 disposed at two opposite sides of the active area 10, the plurality of second signals 13 are electrically connected to the second conductive patterns 15, and each second signal line 13 is electrically connected to the two second conductive patterns 15 through two second switching units 161, respectively.

The first conductive pattern 14 and the second conductive pattern 15 may be regular patterns or irregular patterns. For example, shapes of the first conductive pattern 14 and the second conductive pattern 15 are both rectangular.

Herein, the first conductive pattern 14 and the second conductive pattern 15 are made from a conductive material, such as a metal and/or a metal oxide conductive material. The metal conductive material includes, for example, at least one of Al, Cu, Mo or Ag, and the metal oxide conductive material includes, for example, Indium Tin Oxide (ITO) or Indium Zn Oxide (IZO).

Figure 5A:
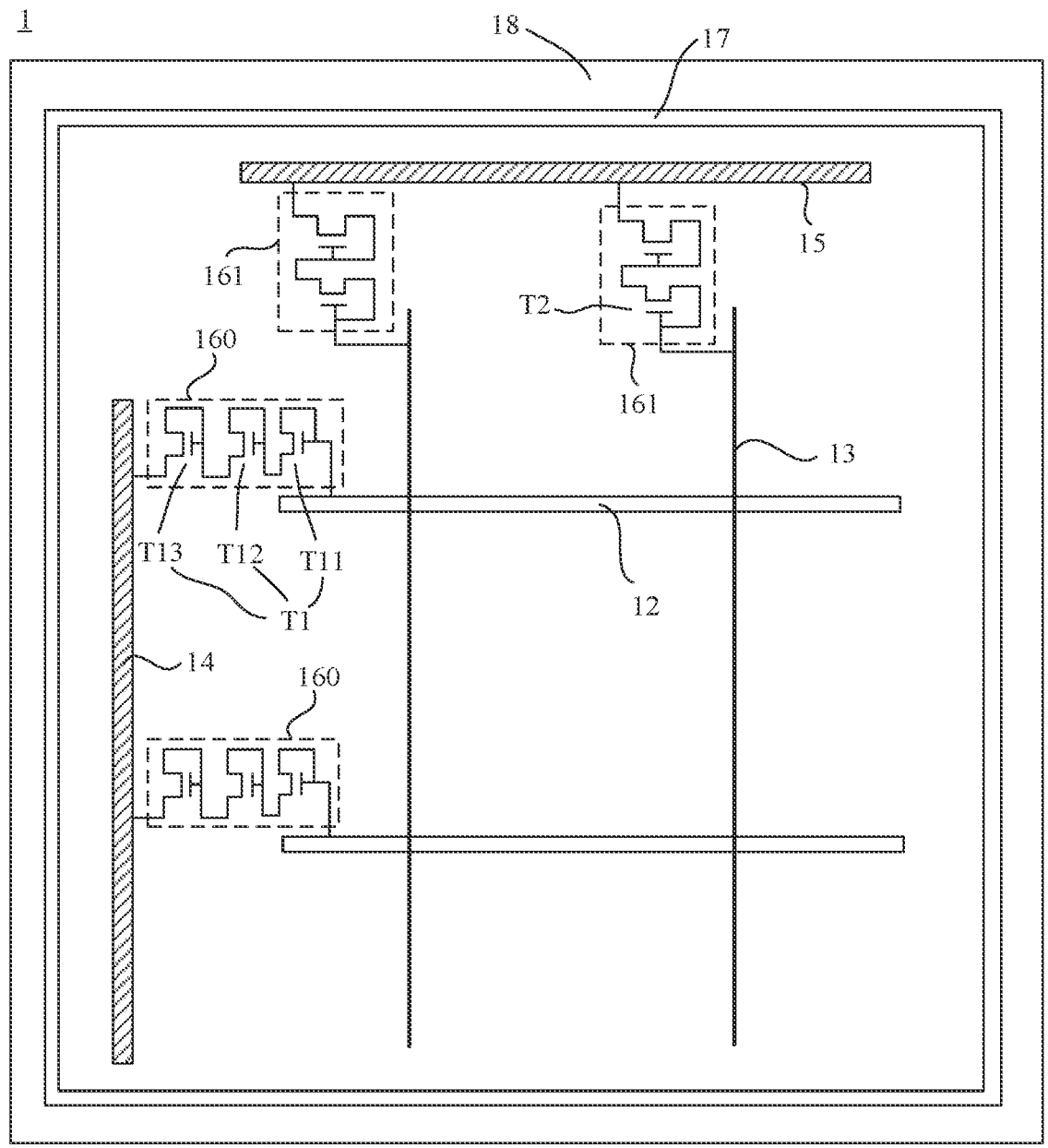
FIG. 5A is a schematic diagram of yet another display panel, in accordance with some embodiments.

In some embodiments, referring to FIG. 5A, the first switching unit 160 includes at least one first thin film transistor T1, the second switching unit 161 includes at least one second thin film transistor T2, and a channel width-to-length ratio (i.e., W/L) of the first thin film transistor T1 is greater than a channel width-to-length ratio of the second thin film transistor T2.

Herein, a channel width-to-length ratio of a thin film transistor is a ratio of a width to a length of a conductive channel formed in an active layer of the thin film transistor when the thin film transistor is turned on, and an on-state current of the thin film transistor is directly proportional to the channel width-to-length ratio.

The channel width-to-length ratio of the first thin film transistor T1 is greater than the channel width-to-length ratio of the second thin film transistor T2. Therefore, the first thin film transistor T1 may have a better capability to discharge the electrostatic charges than the second thin film transistor T2, that is, the first thin film transistor T1 may conduct the electrostatic charges to the first conductive pattern 14 more easily. In a case where the area of the first signal line 12 is greater than the area of the second signal lines 13, that is, in a case where more electrostatic charges are generated on the first signal line 12 than on the second signal line 13, the first switching unit 160 electrically connected to the first signal line 12 may conduct the electrostatic charges to the first conductive pattern 14 more easily. In this way, a risk of the electrostatic charge accumulation and ESD between the components connected to the first signal line 12 may be reduced, and an anti-static property of the display panel 1 may be improved.

For example, a channel length L1 of the first thin film transistor T1 is less than a channel length L2 of the second thin film transistor T2, and a ratio of L1 and L2 is approximately equal to a ratio of the area of the first signal line 12 to the area of the second signal line 13; and/or, a channel width W1 of the first thin film transistor T1 is greater than a channel width W2 of the second thin film transistor T2, and a ratio of W1 to W2 is approximately equal to the ratio of the area of the first signal line 12 to the area of the second signal line 13. In this way, channel width-to-length ratios of the first thin film transistor T1 and the second thin film transistor T2 may be designed according to actual conditions of the signal lines in the display panel 1, so as to better meet the ESD demands of the signal lines.

In some embodiments, the number of the at least one first thin film transistor T1 in the first switching unit 160 and the number of the at least one second thin film transistor T2 in the second switching unit 161 may be determined according to actual needs.

Figure 5B:
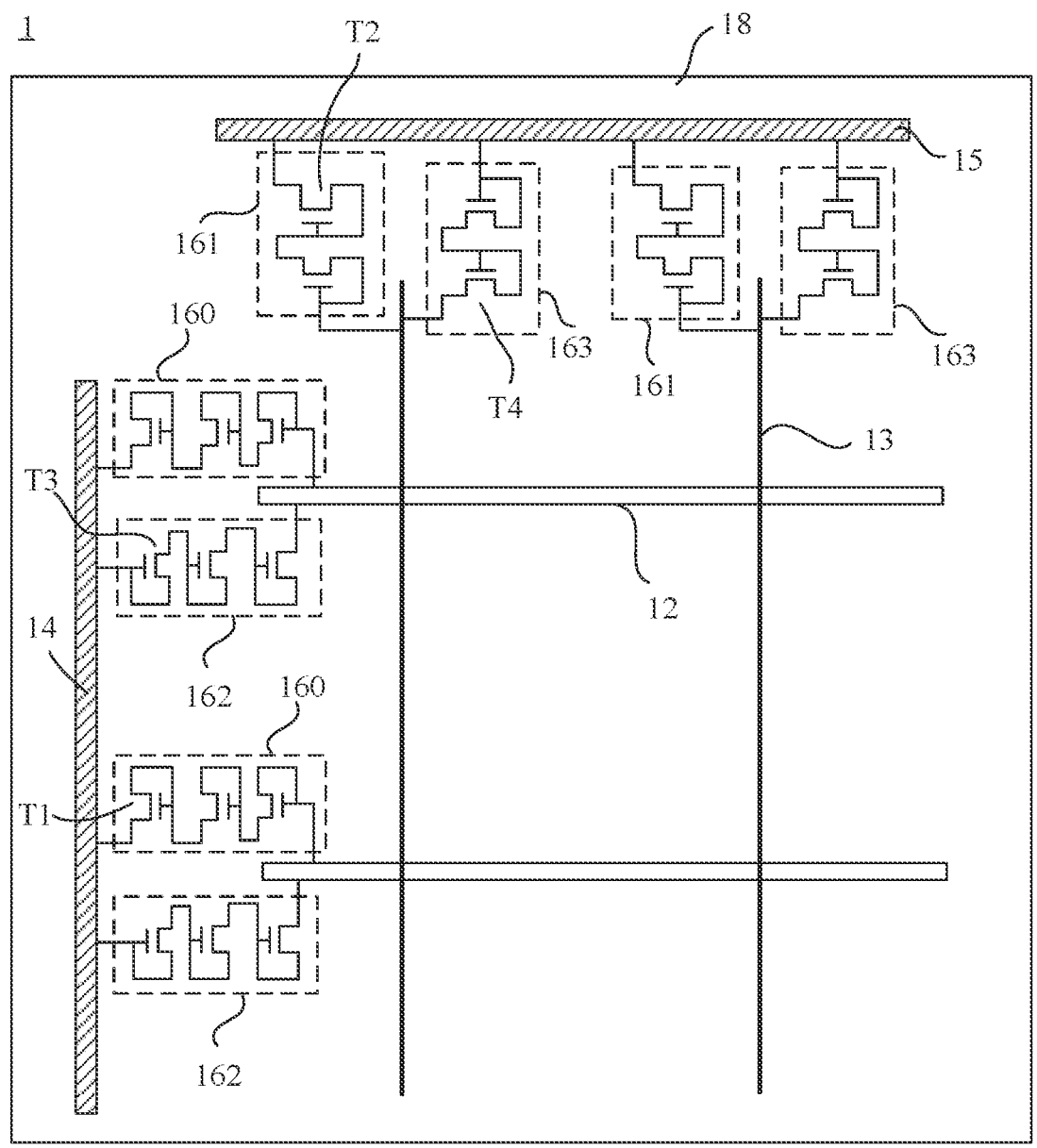
FIG. 5B is a schematic diagram of yet another display panel, in accordance with some embodiments.

For example, referring to FIGS. 5A and 5B, the first switching unit 160 includes at least two first thin film transistors T1, and the number of the at least two first thin film transistors T1 included in the first switching unit 160 is greater than the number of the at least one second thin film transistor T2 included in the second switching unit 161. For example, the first switching unit 160 includes three first thin film transistors T1, and the second switching unit 161 includes two second thin film transistors T2.

In this way, in a case where the area of the first signal line 12 is greater than the area of the second signal line 13, that is, in a case where more electrostatic charges may be generated on the first signal line 12 than on the second signal line 13, by providing more first thin film transistors T1, the total resistance of the first thin film transistors T1 may be increased, and a magnitude of an electrostatic current flowing through each first thin film transistor T1 may be reduced, so as to reduce a risk of burning out of the first thin film transistor T1 in the first switching unit 160 due to an excessive electrostatic current.

In some examples, materials of the first signal line 12 and the second signal line 13 are generally the same or similar, and thus, a material of the signal line has a relatively small impact on the magnitude of the electrostatic charges generated on the signal line, and a magnitude of an area of the signal line has a relatively large impact on the magnitude of electrostatic charges generated on the signal line. Therefore, the impact of the material on the signal line may be ignored herein.

Figure 5C:
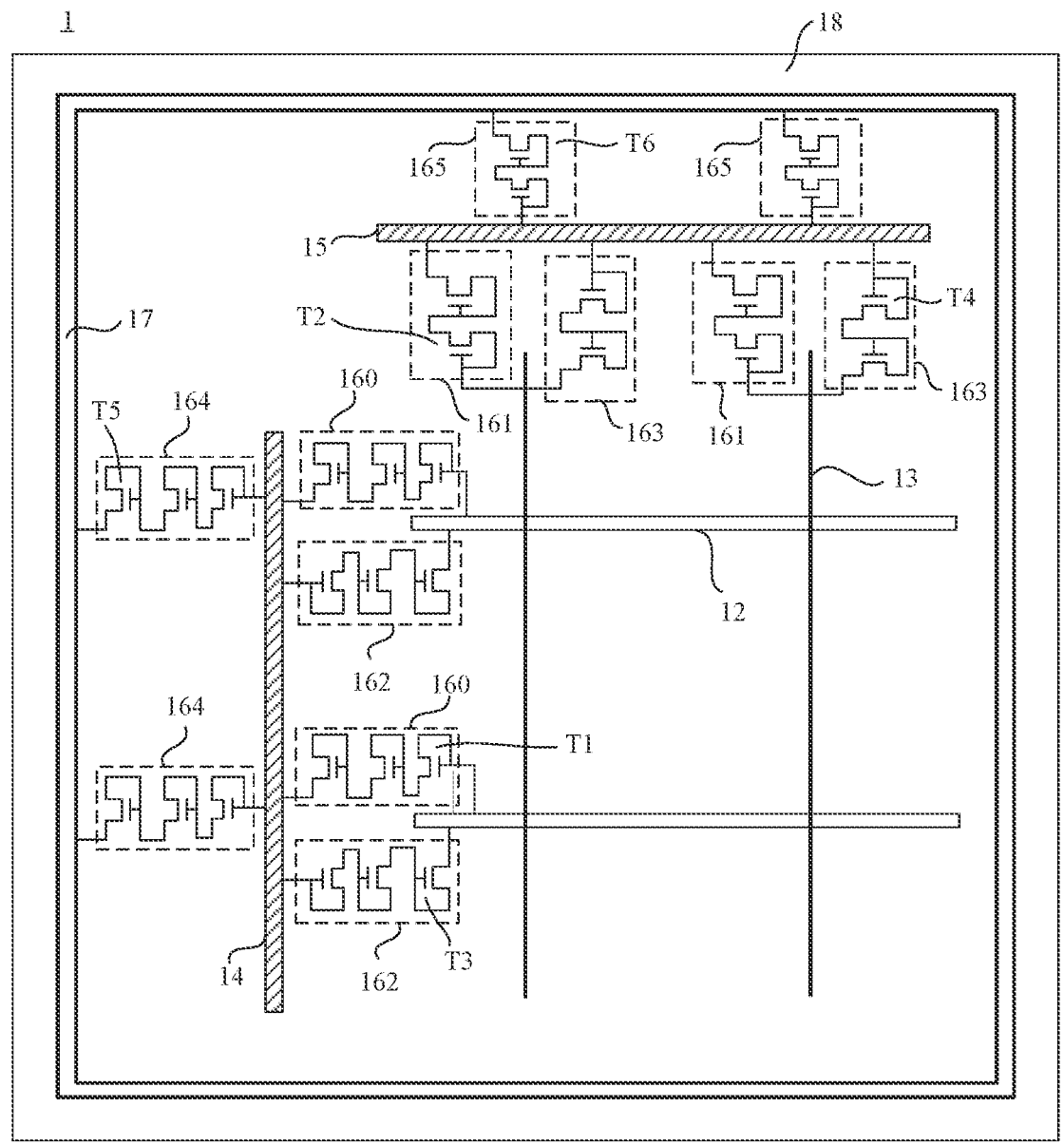
FIG. 5C is a schematic diagram of yet another display panel, in accordance with some embodiments.
Figure 5D:
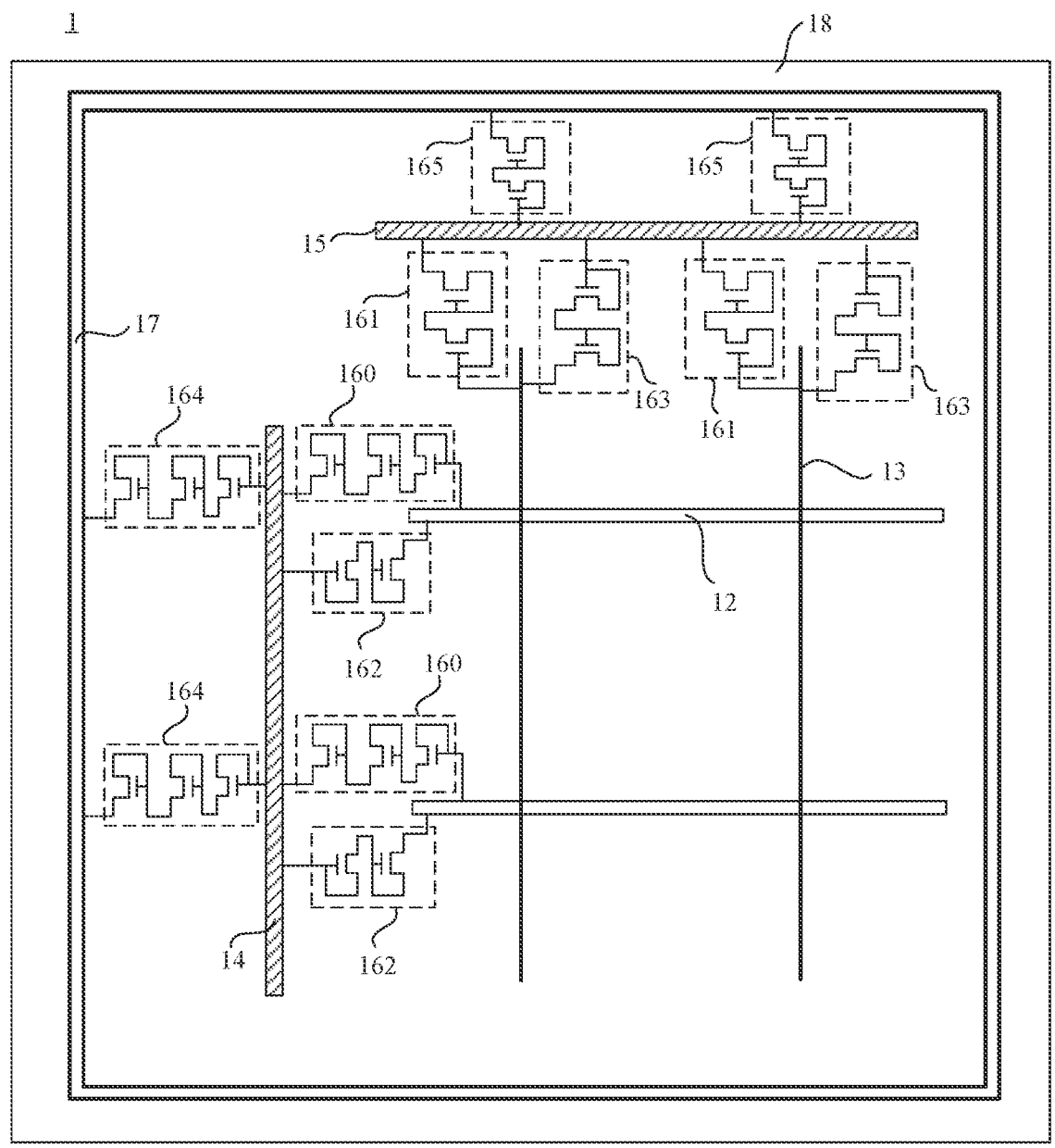
FIG. 5D is a schematic diagram of yet another display panel, in accordance with some embodiments.
Figure 5E:
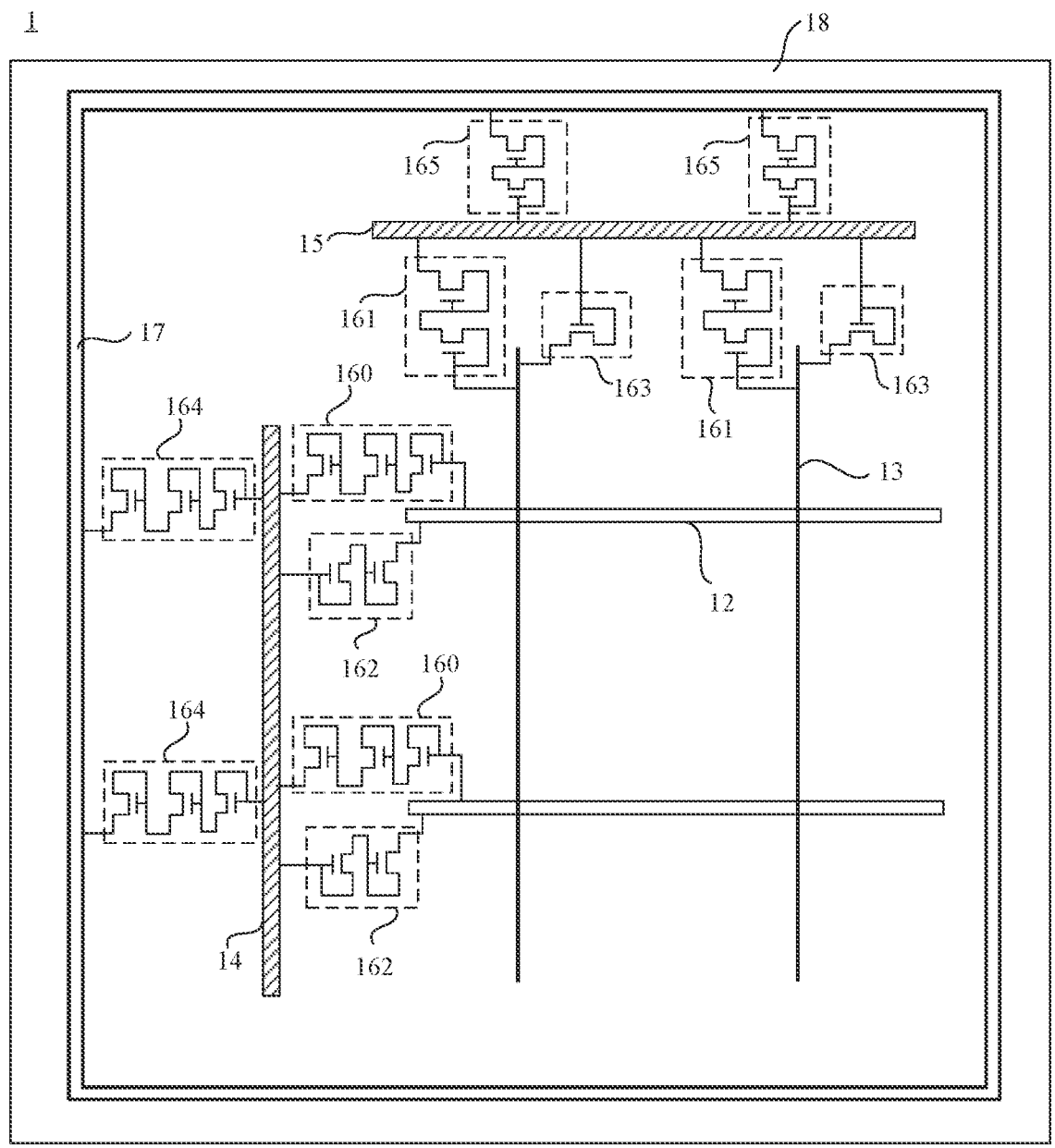
FIG. 5E is a schematic diagram of yet another display panel, in accordance with some embodiments.
Figure 5F:
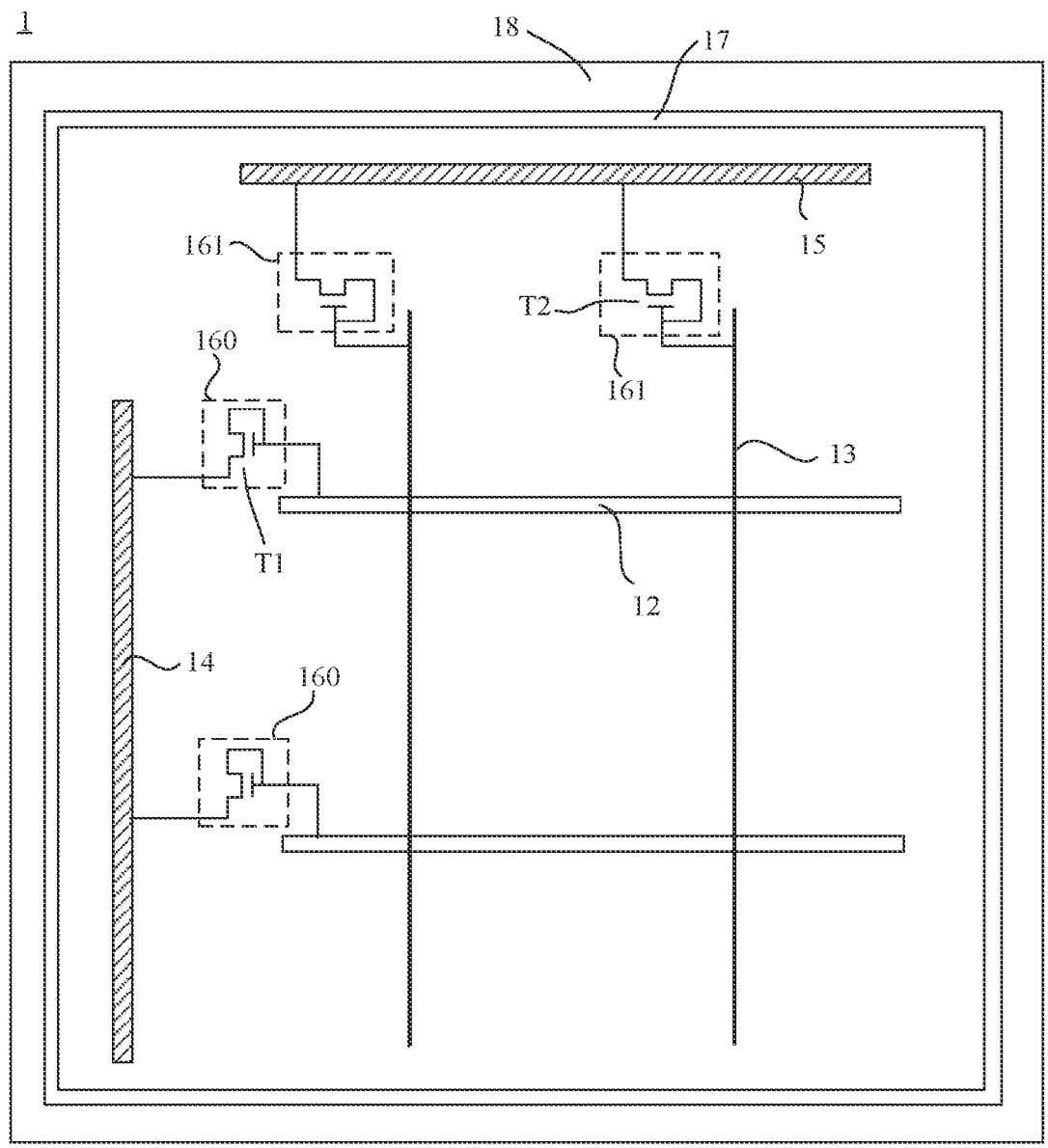
FIG. 5F is a schematic diagram of yet another display panel, in accordance with some embodiments.

In some embodiments, referring to FIG. 5F, the first switching unit 160 includes one first thin film transistor T1, which is close to both a corresponding first signal line 12 and a corresponding first conductive pattern 14. A first electrode of the first thin film transistor T1 is electrically connected to the corresponding first signal line 12, and a second electrode of the first thin film transistor T1 is electrically connected to the corresponding first conductive pattern 14.

In some embodiments, referring to FIG. 5A, the first switching unit 160 includes a plurality of first thin film transistors T1 connected in series, a first electrode of a first thin film transistor T1 closest to a corresponding first signal line 12 is electrically connected to the corresponding first signal line 12, and a second electrode of another first thin film transistor T1 closest to a corresponding first conductive pattern 14 is electrically connected to the corresponding first conductive pattern 14.

Figure 10:
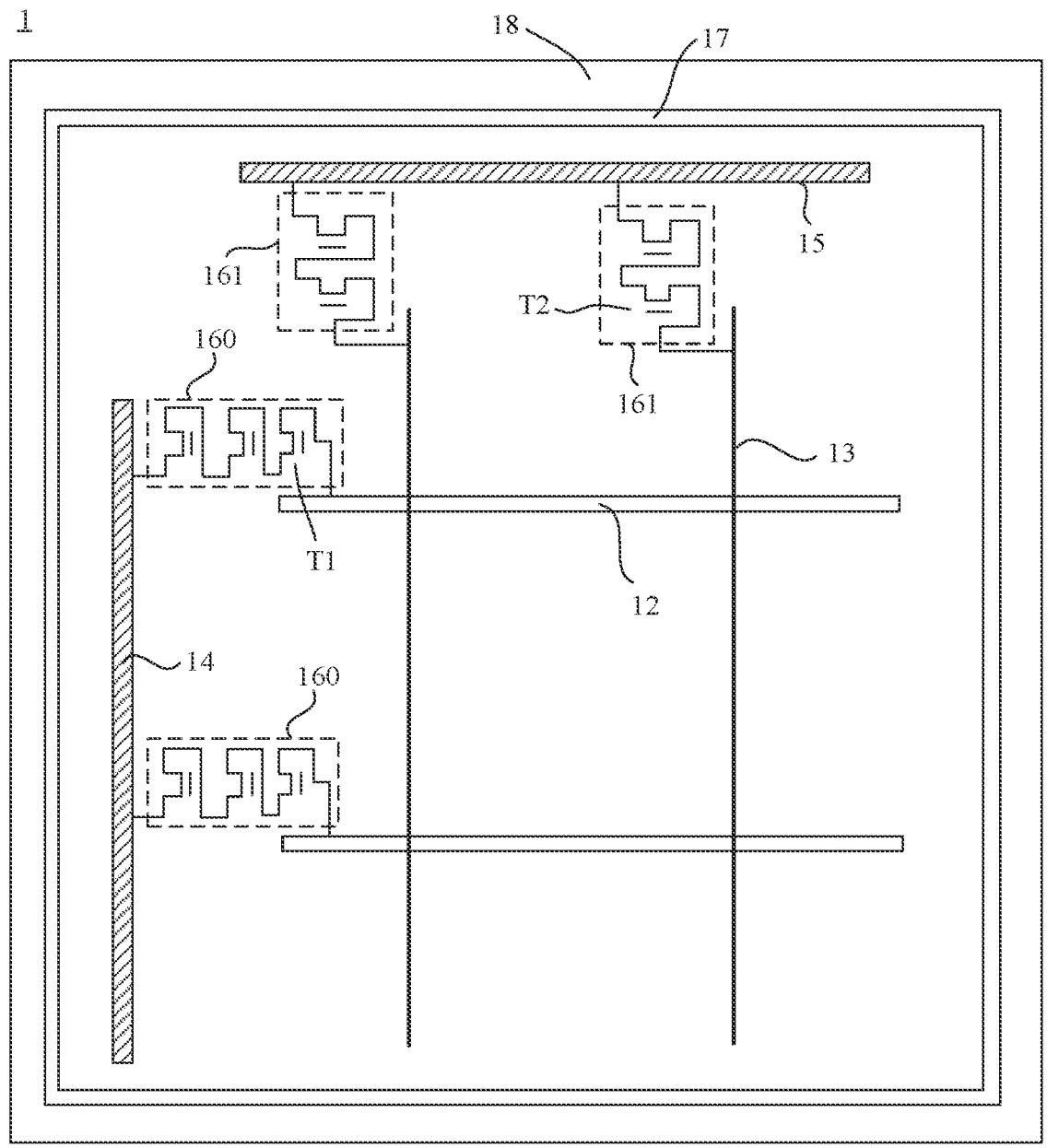
FIG. 10 is a schematic diagram of yet another display panel, in accordance with some embodiments.

Herein, a gate of each first thin film transistor T1 may be electrically connected to a first electrode of the first thin film transistor T1. Or, as shown in FIG. 10, the gate of each first thin film transistor T1 may be a floating gate, that is, the gate is in an independent and insulated state, which means that the gate is not electrically connected to other components or structures such as a signal line, the second electrode or the first electrode of the first thin film transistor T1, and a conductive pattern.

In the case where the gate of the first thin film transistor T1 is the floating gate, there is a capacitor including the gate and the first electrode or a second electrode of the first thin film transistor T1. In this way, by utilizing bootstrap effect of the capacitor, the first thin film transistor T1 may be turned on when there are electrostatic charges conducted to the first electrode or second electrode of the first thin film transistor T1.

In some embodiments, referring to FIG. 5F, the second switching unit 161 includes one second thin film transistor T2, which is close to both a corresponding second signal line 13 and a corresponding second conductive pattern 15. A first electrode of the second thin film transistor T2 is electrically connected to the corresponding second signal line 12, and a second electrode of the second thin film transistor T2 is electrically connected to the corresponding second conductive pattern 15.

In some embodiments, referring to FIG. 5A, the second switching unit 161 includes a plurality of second thin film transistors T2 connected in series, a first electrode of a second thin film transistor T2 closest to a corresponding second signal line 13 is electrically connected to the corresponding second signal line 13, and a second electrode of another second thin film transistor T2 closest to a corresponding second conductive pattern 15 is electrically connected to the corresponding second conductive pattern 15.

The gate of each second thin film transistor T2 may be electrically connected to the first electrode of the second thin film transistor T2. Or, as shown in FIG. 10, the gate of each second thin film transistor T2 may also be a floating gate, and in this case, similar to the first thin film transistor T1, the second thin film transistor T2 may be turned on by utilizing bootstrap effect of a capacitor formed by the gate and the first electrode or a second electrode of the second thin film transistor T2.

Herein, thin film transistors connected in series that are mentioned above and to be mentioned later will be exemplarily described below. In any two of the thin film transistors connected in series, in a flowing direction of a current, a second electrode (e.g., a drain) of a previous thin film transistor is connected to a first electrode (e.g., a source) of a next thin film transistor. For example, as shown in FIG. 5A, the first switching unit 160 includes three first thin film transistors T1 connected in series, which may be referred to as first thin film transistors T11, T12 and T13. In a flowing direction of a current from the first signal line 12 to the first conductive pattern 14, a first electrode of the first thin film transistor T11 is electrically connected to the first signal line 12, and a second electrode of the first thin film transistor T11 is electrically connected to a first electrode of the first thin film transistor T12; and a second electrode of the first thin film transistor T12 is electrically connected to a first electrode of the first thin film transistor T13, and a second electrode of the first thin film transistor T13 is electrically connected to the first conductive pattern 14.

For example, the at least one first conductive pattern 14 and the at least one second conductive pattern 15 are made of a same material, and are disposed in a same layer as gates of the thin film transistors; or the at least one first conductive pattern 14 and the at least one second conductive pattern 15 are made of a same material, and are disposed in a same layer as the first signal lines 12 and the second signal lines 13. In this way, the first conductive pattern 14 and the second conductive pattern 15 may be formed together with the gates or the signal lines through a same patterning process, which may simplify the manufacturing process of the display panel 1. The patterning process may include a photoetching process includes, for example, exposure, and development, and/or an etching process.

Figure 2A:
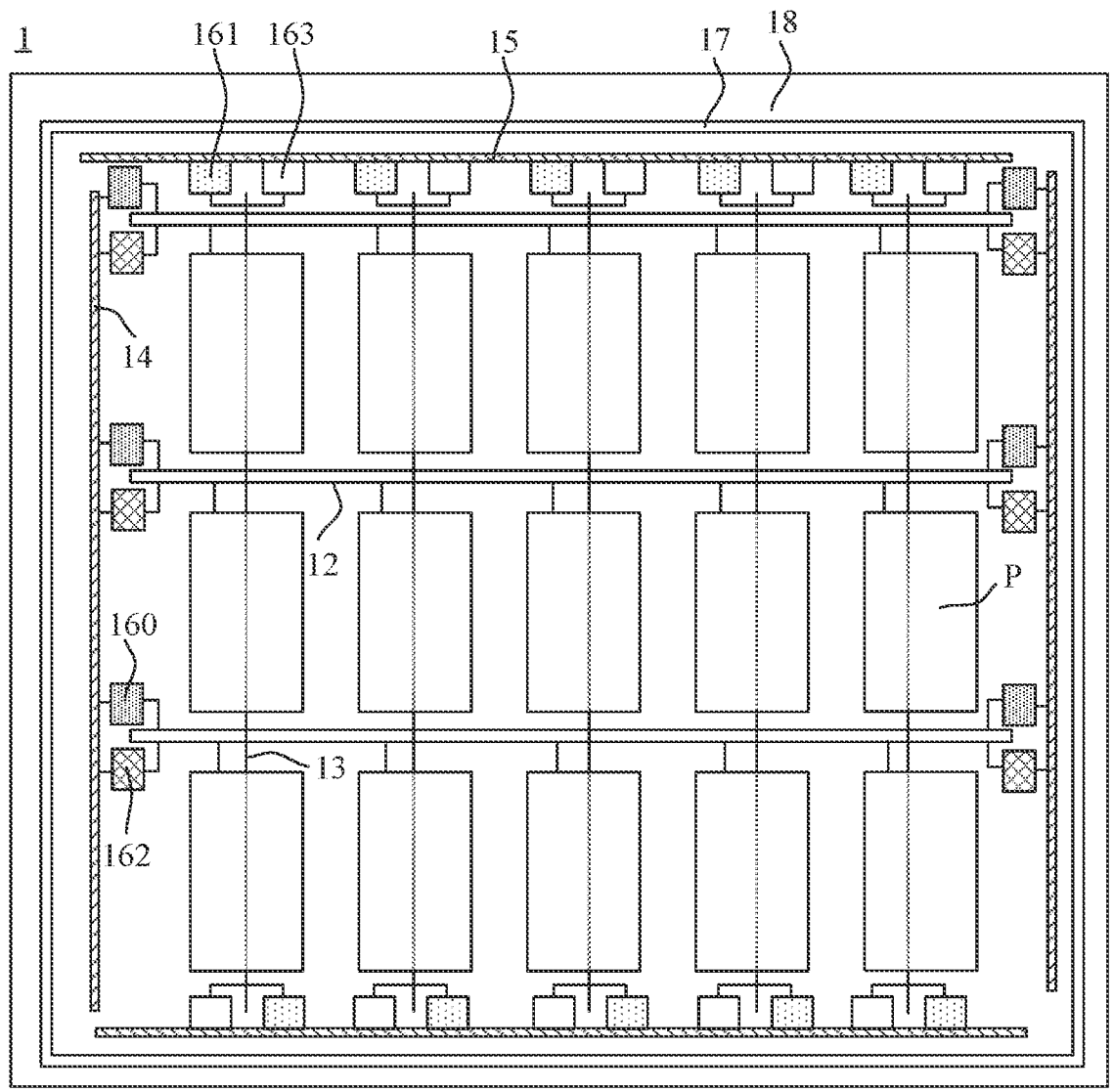
FIG. 2A is a schematic diagram of yet another display panel, in accordance with some embodiments.
Figure 2B:
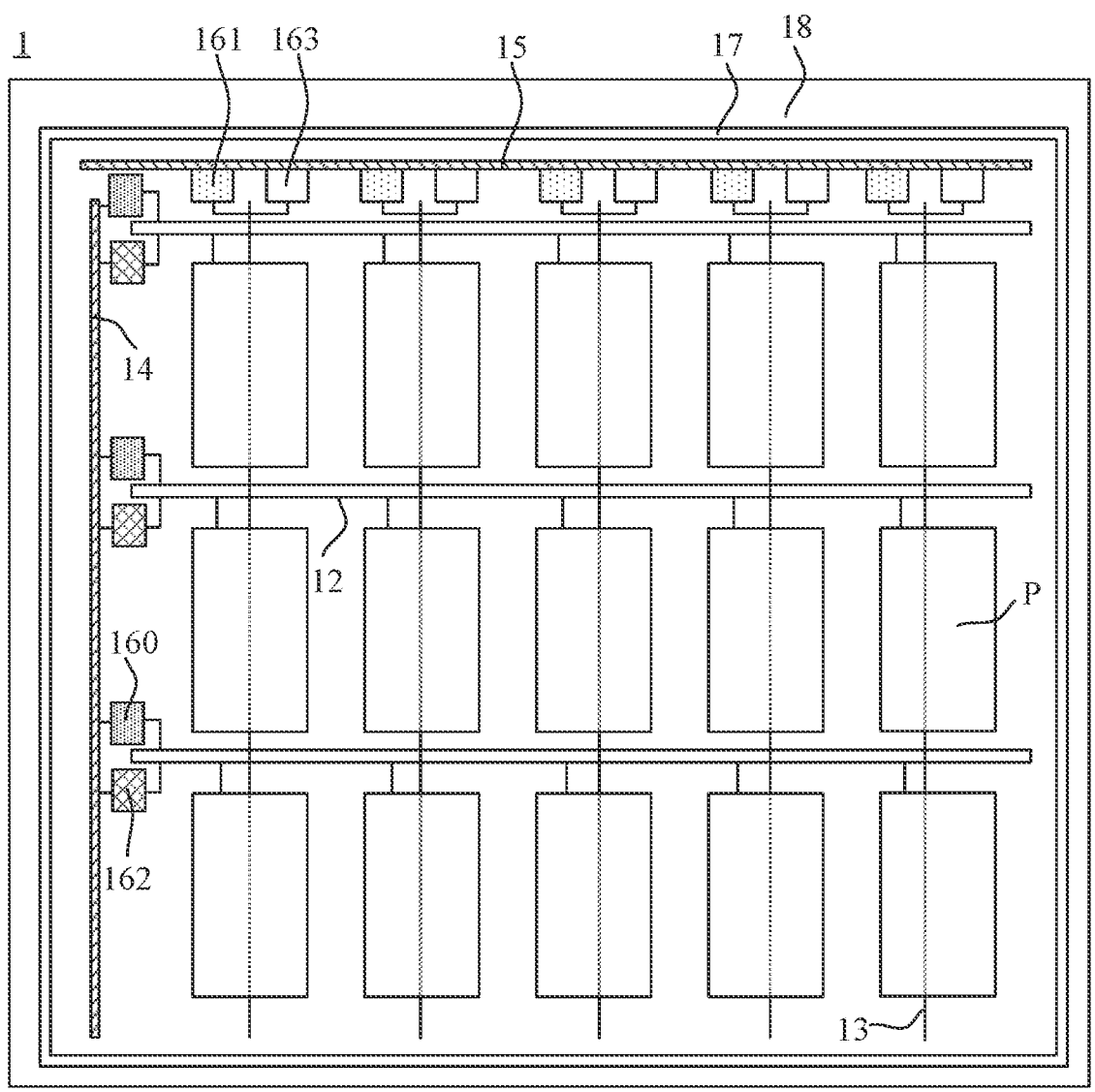
FIG. 2B is a schematic diagram of yet another display panel, in accordance with some embodiments.

In some embodiments, as shown in FIGS. 5A to 5G, the gate of the first thin film transistor T1 is further electrically connected to the first electrode of the first thin film transistor T1. As shown in FIGS. 2A and 2B, the display panel 1 further includes a plurality of third switching units 162, and each first signal line 12 is further electrically connected to the at least one first conductive pattern 14 through at least one third switching unit 162. Each third switching unit 162 includes at least one third thin film transistor T3.

For example, referring to FIG. 2A, the at least one first conductive pattern 14 includes one first conductive pattern 14, the plurality of first signal lines 12 are electrically connected to the first conductive pattern 14, and each first signal line 12 is electrically connected to the first conductive pattern 14 through one third switching unit 162.

In some other examples, the at least one first conductive pattern 14 includes at least two first conductive patterns 14 disposed at two opposite sides of the active area 10, the plurality of first signal lines 12 are electrically connected to the at least two first conductive patterns 14, and each first signal line 12 is electrically connected to the at least two conductive pattern 14 through at least two third switching units 162, respectively. For example, referring to FIG. 2B, the at least one first conductive pattern 14 includes two first conductive patterns 14 disposed at two opposite sides of the active area 10, the plurality of first signal lines 12 are electrically connected to the two first conductive patterns 14, and each first signal line 12 is electrically connected to the two conductive pattern 14 through two third switching units 162, respectively.

Figure 5G:
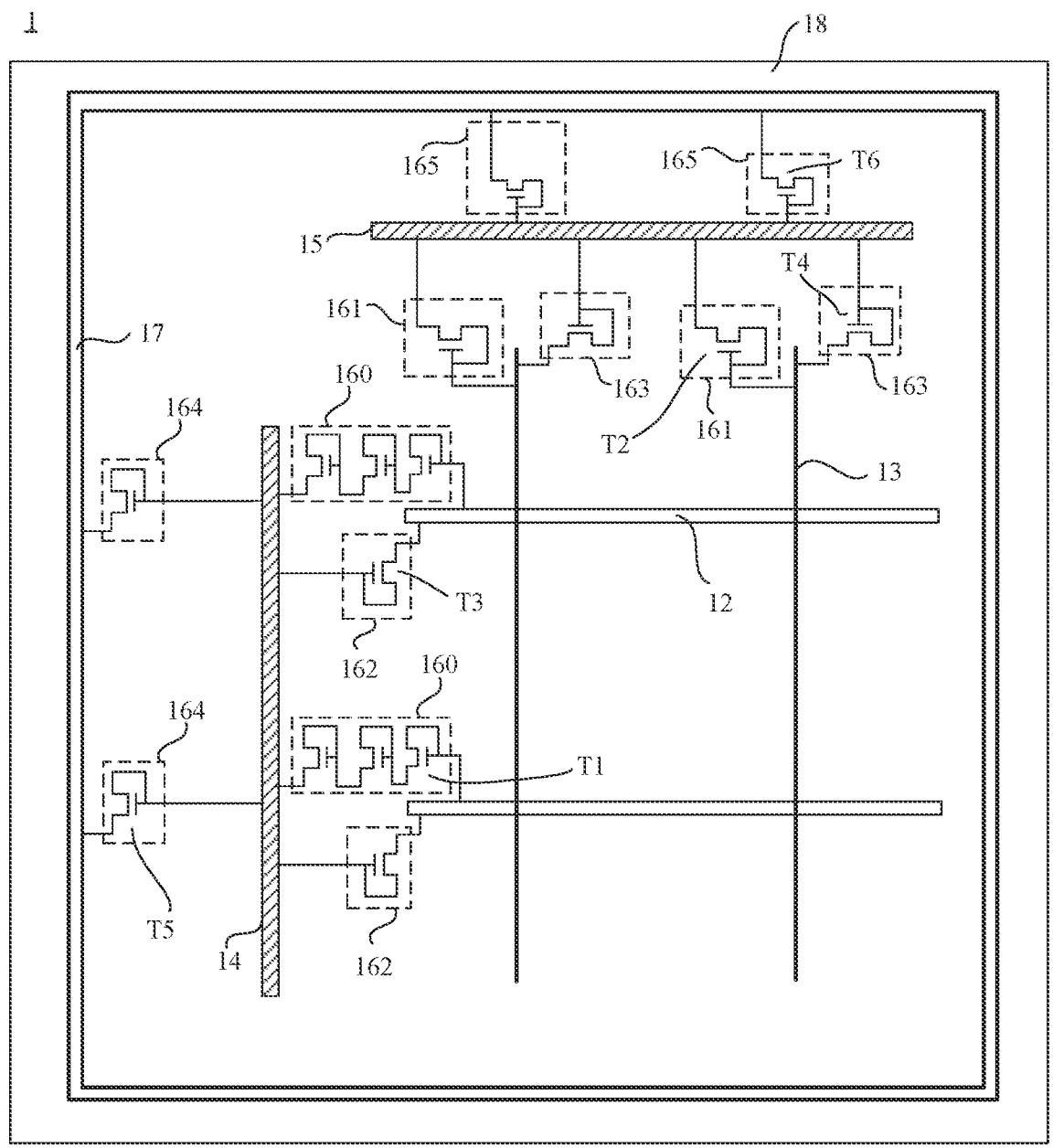
FIG. 5G is a schematic diagram of yet another display panel, in accordance with some embodiments.

For example, as shown in FIG. 5G, the third switching unit 162 includes one third thin film transistor T3, a first electrode of the third thin film transistor T3 is electrically connected to the first conductive pattern 14, and a first electrode of the third thin film transistor T3 is electrically connected to the first signal line 12.

For example, as shown in FIGS. 5B to 5E, the third switching unit 162 includes a plurality of third thin film transistors T3 connected in series. In the third switching unit 162, a first electrode of a third thin film transistor T3 closest to a corresponding first conductive pattern 14 is electrically connected to the corresponding first conductive pattern 14, a second electrode of another third thin film transistor T3 closet to a corresponding first signal line 12 is electrically connected to the first signal line 12, and a gate of each third thin film transistor T3 is electrically connected to a first electrode of the third thin film transistor T3.

For example, the number of the at least one third thin film transistor T3 included in the third switching unit 162 is equal to the number of the at least one first thin film transistor T1 included in a first switching unit 160 that corresponds to a same first signal line 12 with the third switching unit 162, and/or, a channel width-to-length ratio of each third thin film transistor T3 is equal to the channel width-to-length ratio of each first thin film transistor T1.

In some embodiments, as shown in FIGS. 5A and 5G, the gate of the second thin film transistor T2 is further electrically connected to the first electrode of the second thin film transistor T2. As shown in FIGS. 2A and 2B, the display panel 1 further includes a plurality of fourth switching units 163, and each second signal line 13 is further electrically connected to the at least one second conductive pattern 15 through at least one fourth switching unit 163. Each fourth switching unit 163 includes at least one fourth thin film transistor T4.

For example, referring to FIG. 2A, the at least one second conductive pattern 15 includes one second conductive pattern 15, the plurality of second signal lines 13 are electrically connected to the second conductive pattern 15, and each second signal line 13 is electrically connected to the second conductive pattern 15 through one fourth switching unit 163.

In some other examples, the at least one second conductive pattern 15 includes at least two second conductive patterns 15 disposed at two opposite sides of the active area 10, the plurality of second signal lines 13 are electrically connected to the at least two second conductive patterns 15, and each second signal line 13 is electrically connected to the at least two conductive pattern 15 through at least two fourth switching units 163, respectively. For example, referring to FIG. 2B, the at least one second conductive pattern 15 includes two second conductive patterns 15 disposed at two opposite sides of the active area 10, the plurality of second signal lines 13 are electrically connected to the two second conductive patterns 15, and each second signal line 13 is electrically connected to the two conductive pattern 15 through two fourth switching units 163, respectively.

For example, as shown in FIGS. 5E and 5G, the fourth switching unit 163 includes one fourth thin film transistor T4, a first electrode of the fourth thin film transistor T4 is electrically connected to a corresponding second conductive pattern 15, and a second electrode of the fourth thin film transistor T4 is electrically connected to a corresponding second signal line 13.

For example, as shown in FIGS. 5B and 5C, the fourth switching unit 163 includes a plurality of fourth thin film transistors T4 connected in series. A first electrode of a fourth thin film transistor T4 closet to a corresponding second conductive pattern 15 is electrically connected to the corresponding second conductive pattern 15, a second electrode of another fourth thin film transistor T4 closet to a corresponding second signal line 13 is electrically connected to the corresponding second signal line 13, and a gate of each fourth thin film transistor T4 is electrically connected to a first electrode of the fourth thin film transistor T4.

For example, the number of the at least one fourth thin film transistor T4 included in the fourth switching unit 163 is equal to the number of the at least one second thin film transistor T2 included in the second switching unit 161, and/or, a channel width-to-length ratio of each fourth thin film transistor T4 is equal to the channel width-to-length ratio of each second thin film transistor T2.

In some other examples, the number of the at least one third thin film transistor T3 in the third switching unit 162 and the number of the at least one fourth thin film transistor T4 in the fourth switching unit 163 may be the same or different; and a channel width-to-length ratio of the third thin film transistor T3 in the third switching unit 162 and a channel width-to-length ratio of the fourth thin film transistor T4 in the fourth switching unit 163 may be the same or different.

It will be noted that, referring to FIG. 5B, as for each first signal line 12, an electrostatic current may flow from the first signal line 12 to a corresponding first conductive pattern 14 through a corresponding first switching unit 160, and another electrostatic current may flow from the first conductive pattern 14 to the first signal line 12 through a corresponding third switching unit 162. In this way, in a case whether positive or negative electrostatic charges are generated on the first signal line 12, i.e., whether the electrostatic current flows towards the corresponding first conductive pattern 14 or towards the first signal line 12, the electrostatic charges may be conducted from the first signal line 12 to the corresponding first conductive pattern 14.

Similarly, as for each second signal line 13, an electrostatic current may flow from the second signal line 13 to a corresponding second conductive pattern 15 through a corresponding second switching unit 161, and another electrostatic current may flow from the second conductive pattern 15 to the second signal line 13 through a corresponding fourth switching unit 163. In this way, in a case whether positive or negative electrostatic charges are generated on the second signal line 13, i.e., whether the electrostatic current flows towards the corresponding second conductive pattern 15 or towards the second signal line 13, the electrostatic charges may be conducted from the second signal line 13 to the corresponding second conductive pattern 15.

In addition, electrostatic charges on a certain first signal line 12 (or some first signal lines 12) may be conducted to a corresponding first conductive pattern 14 through a corresponding first switching unit 160. Through a corresponding third switching unit 162, part of electrostatic charges on the first signal line 12 may be conducted to other first signal lines 12 that are electrically connected to a same first conductive pattern 14 together with the first signal line 12, so that an area available for electrostatic charge distribution may be increased, which may be beneficial to reducing the accumulation of the electrostatic charges and an electrostatic voltage.

Similarly, electrostatic charges on a certain second signal line 13 may be conducted to a corresponding second conductive pattern 15 through a corresponding second switching unit 161, and part of electrostatic charges on the second signal line 13 may be conducted to other second signal lines 13 that are electrically connected to the same second conductive pattern 15 together with the second signal line 13, so that an area available for electrostatic charge distribution may be increased, which may be beneficial to reducing the accumulation of the electrostatic charges and an electrostatic voltage.

Herein, the number of the at least one first thin film transistor T1 in the first switching unit 160 and the number of the at least one third thin film transistor T3 in the third switching unit 162 may be equal. In this case, sizes of the first switching unit 160 and the third switching unit 162 may be set to be approximately equal, which is convenient to connect the first switching units 160 and the third switching units 162 to the first conductive pattern 14. The number of the at least one second thin film transistor T2 in the second switching unit 161 and the number of the at least one fourth thin film transistor T4 in the fourth switching unit 163 may be equal. In this case, sizes of the second switching unit 161 and the fourth switching unit 163 may be set to be equal, which is convenient to connect the second switching units 161 and the fourth switching units 163 to the second conductive pattern 15.

Figure 3A:
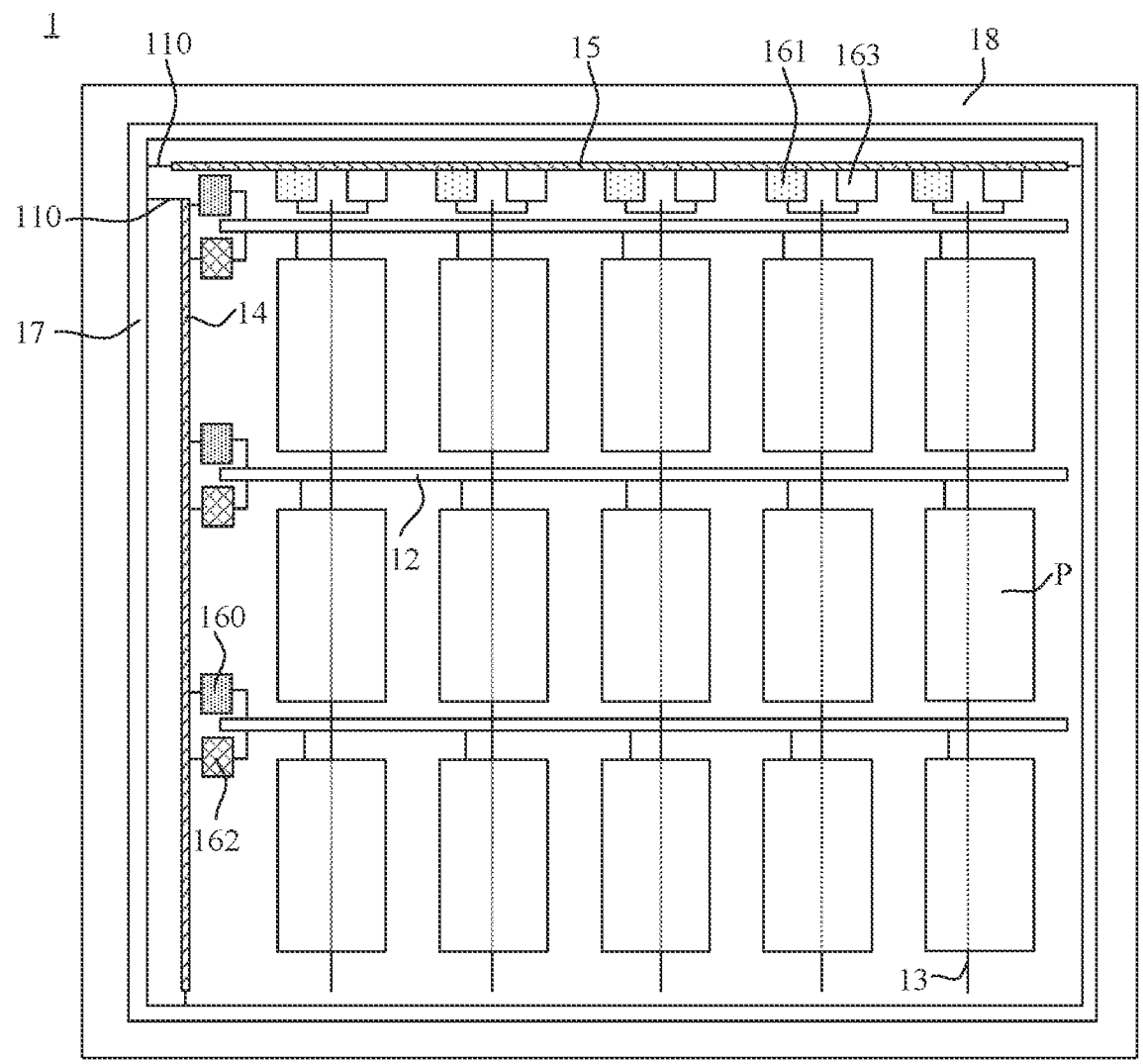
FIG. 3A is a schematic diagram of yet another display panel, in accordance with some embodiments.
Figure 3B:
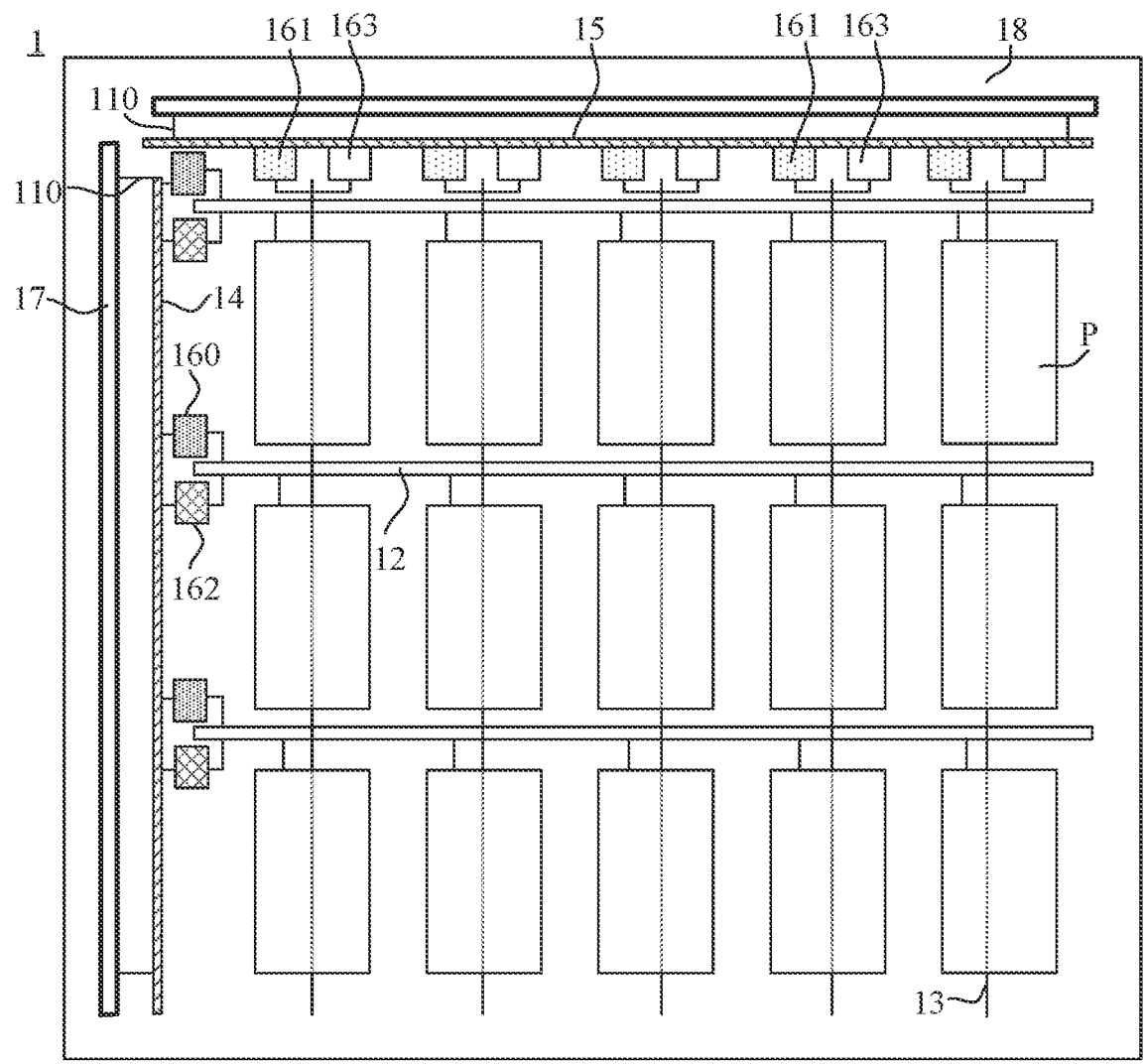
FIG. 3B is a schematic diagram of yet another display panel, in accordance with some embodiments.
Figure 4:
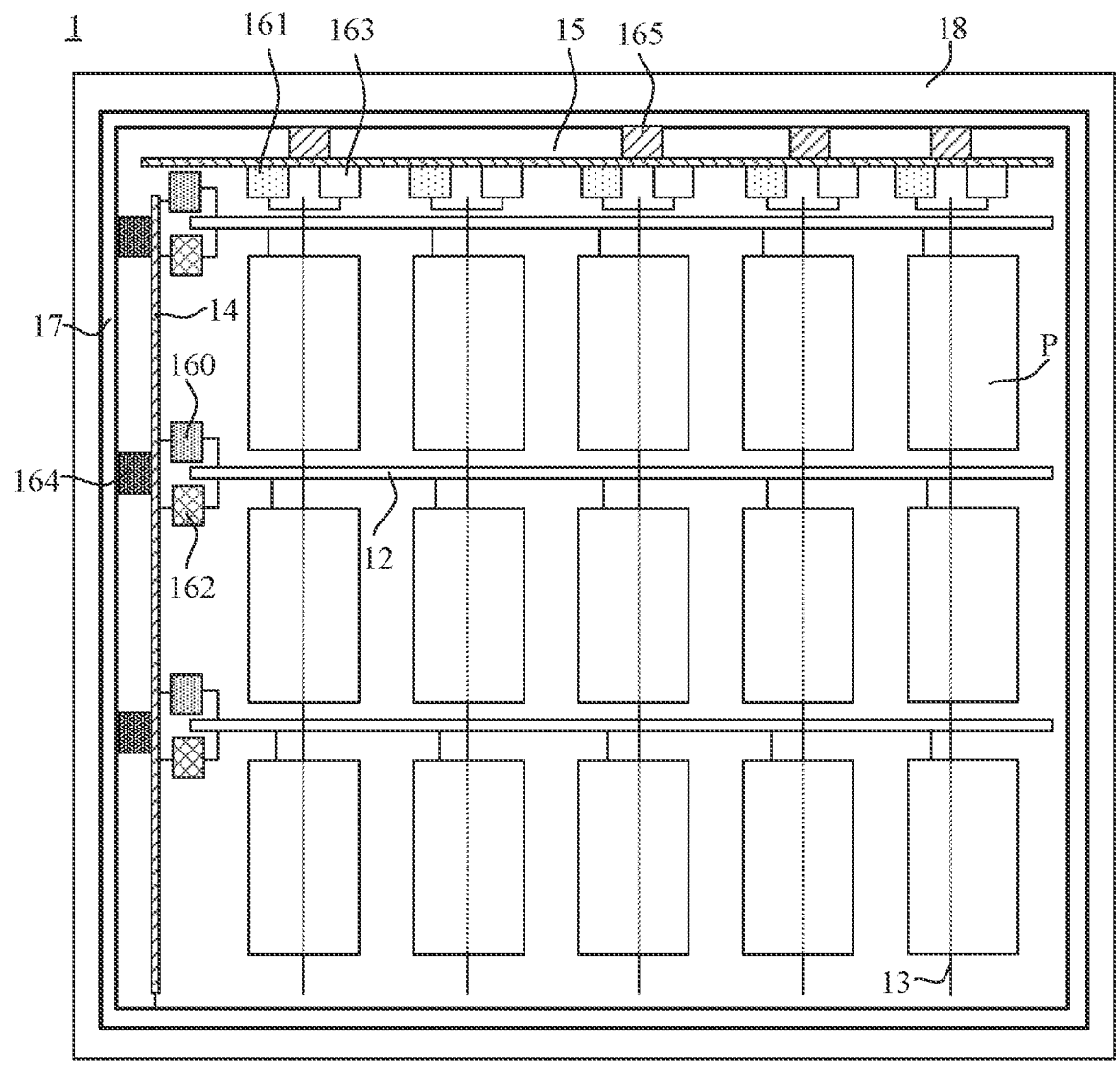
FIG. 4 is a schematic diagram of yet another display panel, in accordance with some embodiments.

In some embodiments, as shown in FIGS. 3A and 3B, the display panel 1 further includes a common electrode line 17 disposed on the substrate 18, and both the at least one first conductive pattern 14 and the at least one second conductive pattern 15 are electrically connected to the common electrode line 17. The common electrode line 17 may be grounded (i.e., a voltage of the common electrode line 17 may be a constant voltage of 0 V). In this way, electrostatic charges on the first signal line 12 and the second signal line 13 are discharged.

For example, as shown in FIGS. 3A and 3B, the first conductive pattern 14 and the second conductive pattern 15 may be electrically connected to the common electrode line 17 through wires 110.

For example, as shown in FIG. 3A, the common electrode line 17 may have a closed loop structure. Or, as shown in FIG. 3B, the common electrode line 17 may have a non-closed loop structure. For example, the common electrode line 17 includes a plurality of portions that are separately provided.

In some embodiments, referring to FIGS. 5C to 5E, the display panel 1 further includes a plurality of fifth switching units 164 and a plurality of sixth switching units 165.

Each first conductive pattern 14 is electrically connected to the common electrode line 17 through at least one fifth switching unit 164. The fifth switching unit 164 includes at least one fifth thin film transistor T5.

For example, as shown in FIG. 5G, the fifth switching unit 164 includes one fifth thin film transistor T5, a first electrode of the fifth thin film transistor T5 is electrically connected to a corresponding first conductive pattern 14, and a second electrode of the fifth thin film transistor T5 is electrically connected to the common electrode line 17.

For another example, as shown in FIGS. 5C to 5E, the fifth switching unit 164 includes a plurality of fifth thin film transistors T5 connected in series. In the fifth switching unit 164, a first electrode of a fifth thin film transistor T5 closet to a corresponding first conductive pattern 14 is electrically connected to the corresponding first conductive pattern 14, a second electrode of another fifth thin film transistor T5 closet to the common electrode line 17 is electrically connected to the common electrode line 17, and a gate of each fifth thin film transistor T5 is electrically connected to a first electrode of the fifth thin film transistor T5.

Each second conductive pattern 15 is electrically connected to the common electrode line 17 through at least one sixth switching unit 165. The sixth switching unit 165 includes at least one sixth thin film transistor T6.

For example, as shown in FIG. 5G, the sixth switching unit 165 includes one sixth thin film transistor T6, a first electrode of the sixth thin film transistor T6 is electrically connected to a corresponding second conductive pattern 15, and a second electrode of the sixth thin film transistor T6 is electrically connected to the common electrode line 17.

For example, as shown in FIGS. 5C to 5E, the sixth switching unit 165 includes a plurality of sixth thin film transistors T6 connected in series. In the sixth switching unit 165, a first electrode of a sixth thin film transistor T6 closet to a corresponding second conductive pattern 15 is electrically connected to the corresponding second conductive pattern 15, a second electrode of another sixth thin film transistor T6 closet to the common electrode line 17 is electrically connected to the common electrode line 17, and a gate of each sixth thin film transistor T6 is electrically connected to a first electrode of the sixth thin film transistor T6.

The fifth switching unit 164 is used for conducting electrostatic charges on the first conductive pattern 14 to the common electrode line 17, and the sixth switching unit 165 is used for conducting electrostatic charges on the second conductive pattern 15 to the common electrode line 17.

In some embodiments, referring to FIGS. 5C, 5D and 5E, the number of the at least one fifth thin film transistor T5 included in the fifth switching unit 164 is the same as the number of the at least one first thin film transistor T1 included in the first switching unit 160, and/or the number of the at least one sixth thin film transistor T6 included in the sixth switching unit 165 is the same as the number of the at least one second thin film transistor T2 included in the second switching unit 161.

In some embodiments, a channel width-to-length ratio of the fifth thin film transistor T5 is substantially equal to the channel width-to-length ratio of the first thin film transistor T1, and/or, a channel width-to-length ratio of the sixth thin film transistor T6 is substantially equal to the channel width-to-length ratio of the second thin film transistor T2.

For example, the channel width-to-length ratio of each fifth thin film transistor T5 is substantially equal to the channel width-to-length ratio of each sixth thin film transistor T6.

In some embodiments, as shown in FIGS. 5A and 5B, the first switching unit 160 includes a plurality of first thin film transistors T1 connected in series, and a channel width-to-length ratio of a first thin film transistor T1 closest to the first signal line 12 is greater than a channel width-to-length ratio of each remaining first thin film transistor T1.

In some embodiments, as shown in FIGS. 5A and 5B, the second switching unit 161 includes a plurality of second thin film transistors T2 connected in series, and a channel width-to-length ratio of a second thin film transistor T2 closest to the second signal line 13 is greater than a channel width-to-length ratio of each remaining second thin film transistor T2.

It will also be noted that, in a case where a magnitude of a current flowing through a thin film transistor is substantially constant, a voltage drop across the thin film transistor is inversely proportional with a channel width-to-length ratio of the thin film transistor. In this way, in the first switching unit 160, a voltage drop across the first thin film transistor T1 proximate to the first signal line 12 is small, which is beneficial for each of remaining first thin film transistors T1 (referring to first thin film transistors T1 through which the current flows after flowing through the first thin film transistor T1 proximate to the first signal line 12 in a flowing direction of the current) to be turned on. Similarly, the second thin film transistors T2 in the second switching unit 161 are arranged as described above, which may also be beneficial for each of remaining second thin film transistors T2 (referring to second thin film transistors T2 through which the current flows after flowing through the second thin film transistor T2 proximate to the second signal line 13 in a flowing direction of the current) to be turned on. As a result, it is more beneficial for the electrostatic charges to be conducted out of the first signal line 12, the second signal line 13 and the components connected thereto.

For example, as shown in FIG. 5C, in the three first thin film transistors T1 of the first switching unit 160, channel width-to-length ratios of the three first thin film transistors T1 decrease in a flowing direction of the current from the first signal line 12 to the first conductive pattern 14.

For example, the channel width-to-length ratio of the first thin film transistor T1 closest to the first signal line 12 is greater than a channel width-to-length ratio of the first thin film transistor T1 closest to the first conductive pattern 14. A channel width-to-length ratio of a first thin film transistor T1 located between the first thin film transistors T1 closest to the first signal line 12 and the first conductive pattern 14 is less than or equal to the channel width-to-length ratio of the first thin film transistor T1 closest to the first signal line 12, and is greater than or equal to the channel width-to-length ratio of the first thin film transistor T1 closest to the first conductive pattern 14.

Figure 7:
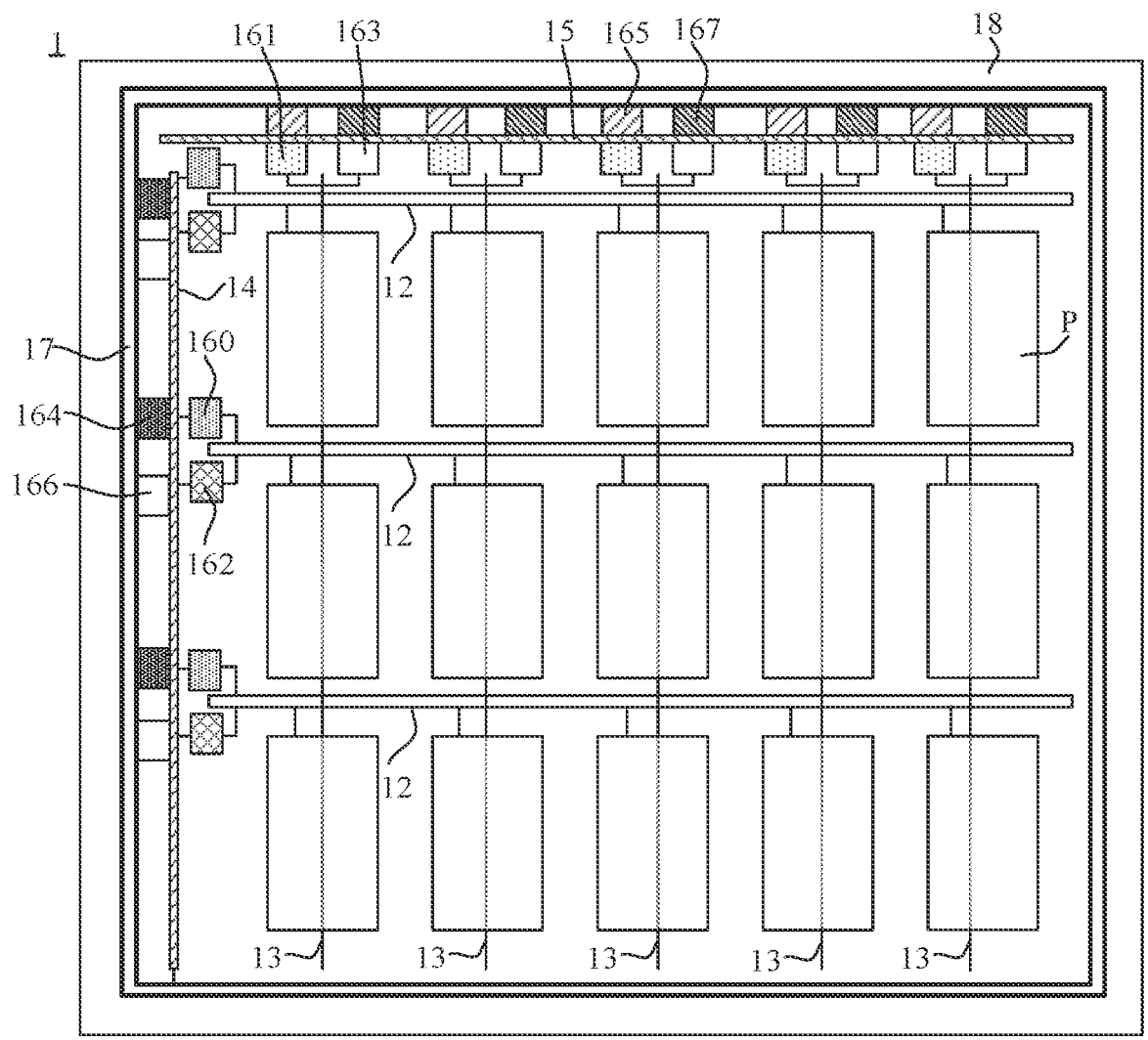
FIG. 7 is a schematic diagram of yet another display panel, in accordance with some embodiments.

In some embodiments, as shown in FIG. 7, the display panel 1 further includes a plurality of seventh switching units 166 and a plurality of eighth switching units 167. An input terminal of each seventh switching unit 166 is electrically connected to the common electrode line 17, and an output terminal thereof is electrically connected to the first conductive pattern 14. An input terminal of each eighth switching unit 167 is electrically connected to the common electrode line 17, and an output terminal thereof is electrically connected to the second conductive pattern 15.

For example, each of a seventh switching unit 166 and an eighth switching unit 167 includes at least one thin film transistor.

The seventh switching unit 166 and the eighth switching unit 167 are configured to conduct electrostatic charges on the common electrode line 17 to a corresponding first conductive pattern 14 and a corresponding second conductive pattern 15, respectively, so that electrostatic charges may further be conducted to the first signal lines 12 and the second signal lines 13 through the corresponding first conductive pattern 14 and the corresponding second conductive pattern 15, respectively. In this way, the first signal lines 12, the second signal lines 13, the at least one first conductive pattern 14, the at least one second conductive pattern 15 and the common electrode line 17 are all available for distributing electrostatic charges. As a result, the area available for electrostatic charge distribution may be further increased. The electrostatic voltage may drop rapidly, and the display panel 1 may have a better buffering effect against electrostatic charges, which may prevent the display panel 1 from being damaged.

For example, after electrostatic charges on a certain first signal line 12 are conducted to the common electrode line 17 through a corresponding sixth switching unit 164, electrostatic charges on the common electrode line 17 may be conducted to remaining first signal lines 12 and second signal lines 13 that are electrically connected to the common electrode line 17 through third switching units 162, fourth switching units 163, sixth switching units 166 and eighth switching units 167, so that the area available for electrostatic charge distribution may be increased, and the risk of electrostatic accumulation may be reduced.

Referring to FIGS. 5A to 5E, structures of switching units electrically connected to the first conductive pattern 14 and the second conductive pattern 15 will be exemplarily described. It will be noted that the description is made in a case where the display panel 1 includes one first conductive pattern 14 and one second conductive pattern 15, a gate of a thin film transistor included in each switching unit is electrically connected to a first electrode thereof, and a first electrode of each thin film transistor is a source and a second 2?electrode thereof is a drain. That is, the gate is electrically connected to the source in each thin film transistor.

In one example, as shown in FIG. 5A, the switching units electrically connected to the first conductive pattern 14 include first switching units 160, and the switching units electrically connected to the second conductive pattern 15 include second switching units 161. In the first switching unit 160, a gate of a first thin film transistor T1 closest to a corresponding first signal line 12 is electrically connected to the corresponding first signal line 12, and a drain of another first thin film transistor T1 closest to the first conductive pattern 14 is electrically connected to the first conductive pattern 14. In the second switching unit 161, a gate of a second thin film transistor T2 closest to a corresponding second signal line 13 is electrically connected to the corresponding second signal line 13, and a drain of another second thin film transistor T2 closest to the second conductive pattern 15 is electrically connected to the second conductive pattern 15.

In another example, as shown in FIG. 5B, switching units electrically connected to the first conductive pattern 14 include first switching units 160 and third switching units 162, and switching units electrically connected to the second conductive pattern 15 include second switching units 161 and fourth switching units 163. In the third switching unit 162, a drain of a third thin film transistor T3 closet to a corresponding first signal line 12 is electrically connected to the corresponding first signal line 12, and a gate of another third thin film transistor T3 closet to the first conductive pattern 14 is electrically connected to the first conductive pattern 14. In the fourth switching unit 163, a drain of a fourth thin film transistor T4 closet to a corresponding second signal line 13 is electrically connected to the corresponding second signal line 13, and a gate of another fourth thin film transistor T4 closet to the second conductive pattern 15 is electrically connected to the second conductive pattern 15.

In yet another example, as shown in FIGS. 5C to 5E, switching units electrically connected to the first conductive pattern 14 include first switching units 160, third switching units 162 and fifth switching units 164, and switching units electrically connected to the second conductive pattern 15 include second switching units 161, fourth switching units 163 and sixth switching units 165. For thin film transistors in the first switching unit 160, the second switching unit 161, the third switching unit 162 and the fourth switching unit 163, reference may be made to the descriptions in the above examples. Herein, structures of the fifth switching unit 164 and the sixth switching unit 165 will be described. In the fifth switching unit 164, a gate of a fifth thin film transistor T5 closet to the first conductive pattern 14 is electrically connected to the first conductive pattern 14, and a drain of another fifth thin film transistor T5 closet to the common electrode line 17 is electrically connected to the common electrode line 17. In the sixth switching unit 165, a gate of a sixth thin film transistor T6 closet to the second conductive pattern 15 is electrically connected to the second conductive pattern 15, and a drain of another sixth thin film transistor T6 closest to the common electrode line 17 is electrically connected to the common electrode line 17.

In some examples, as shown in FIGS. 9A to 9F, each thin film transistor included in the switching units includes a gate 1680, a gate insulating layer, an active layer 1681, a source and drain layer, which are sequentially arranged in a thickness direction of the thin film transistor. The source and drain layer includes a source 1682 and a drain 1683.

Figure 9A:
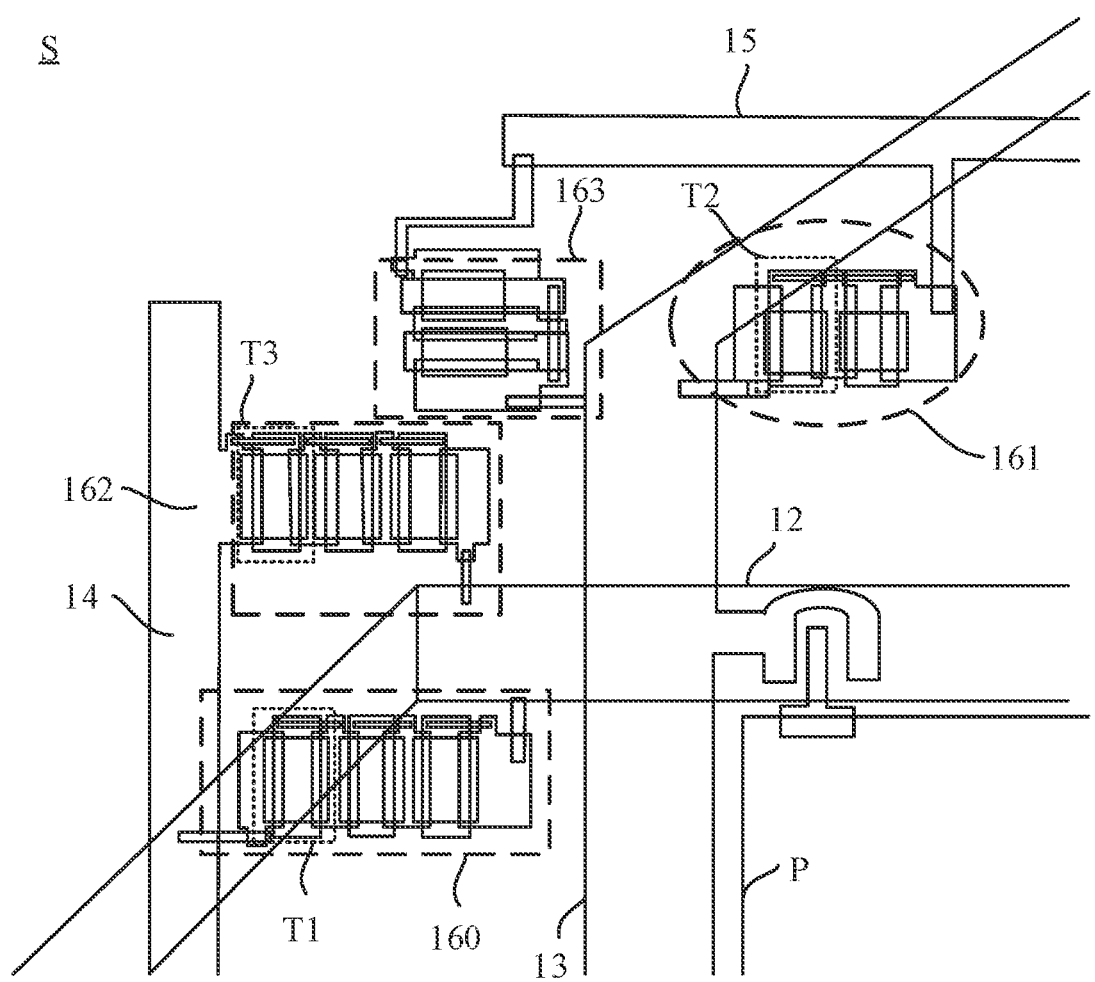
FIG. 9A is a partially enlarged diagram of the portion S of the display panel in FIG. 8, in accordance with some embodiments.
Figure 9B:
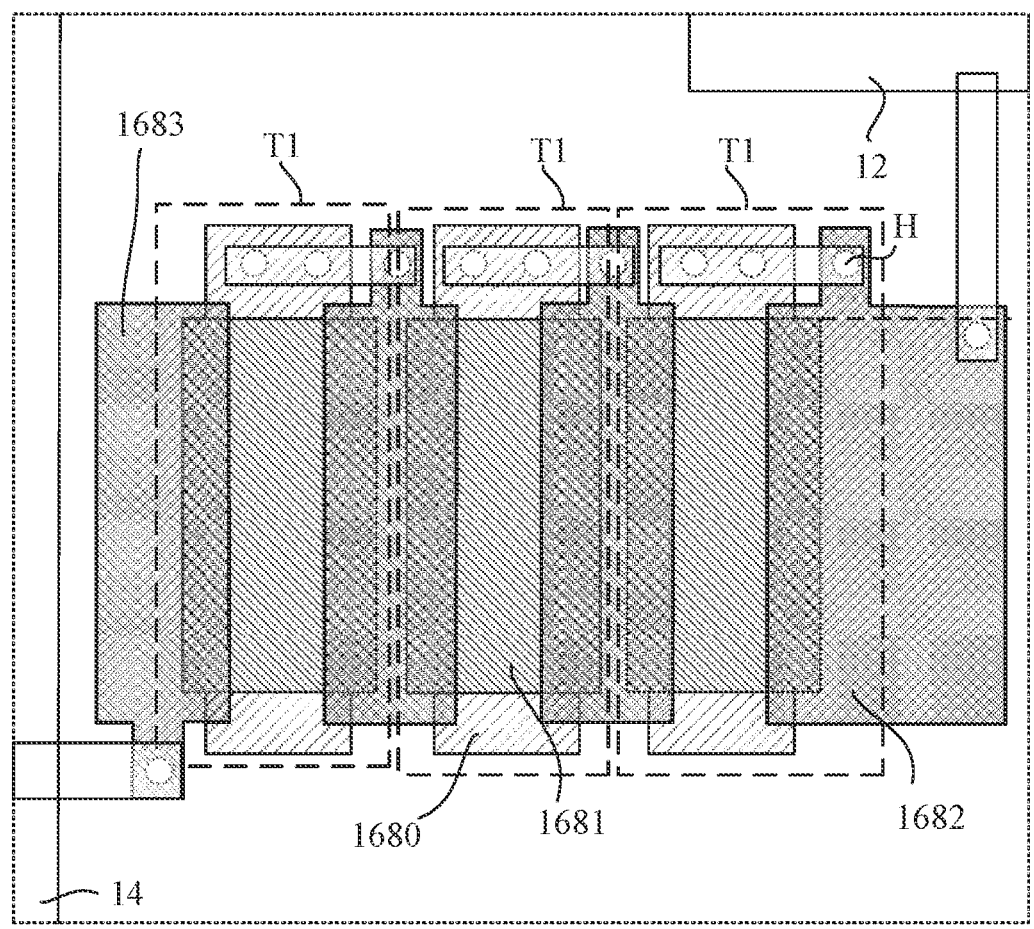
FIG. 9B is a schematic diagram of a switching unit, in accordance with some embodiments.
Figure 9C:
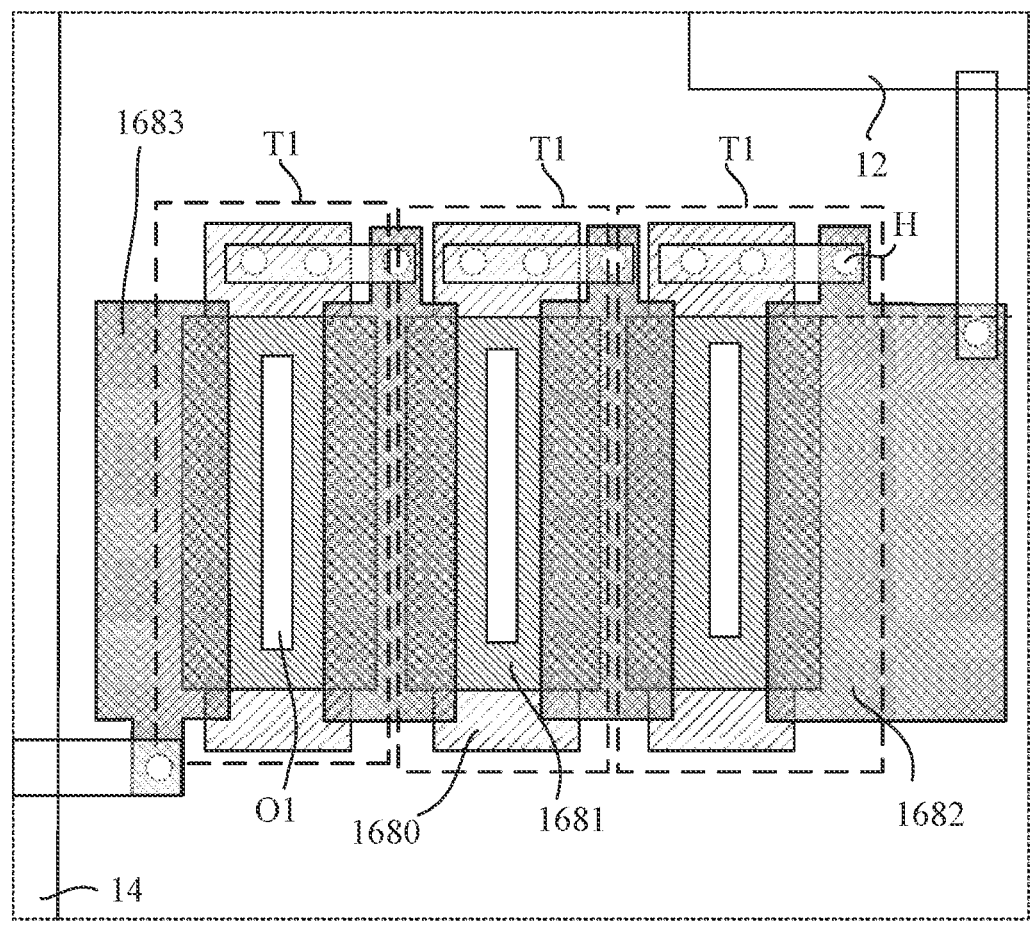
FIG. 9C is a schematic diagram of another switching unit, in accordance with some embodiments.
Figure 9D:
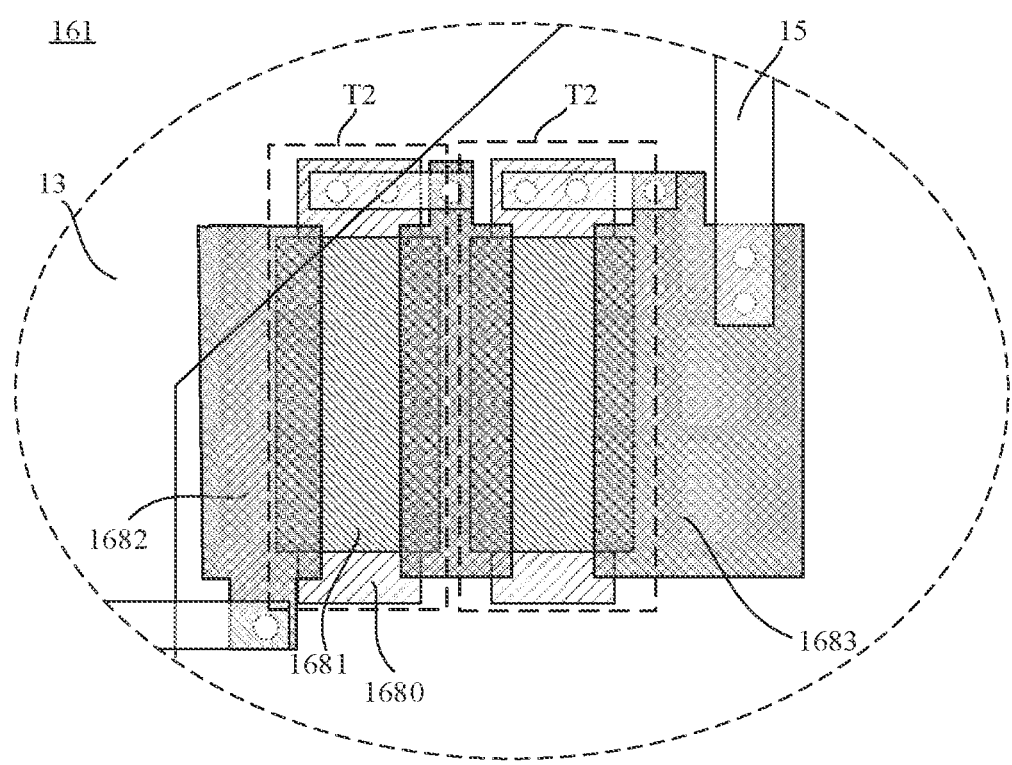
FIG. 9D is a schematic diagram of yet another switching unit, in accordance with some embodiments.
Figure 9E:
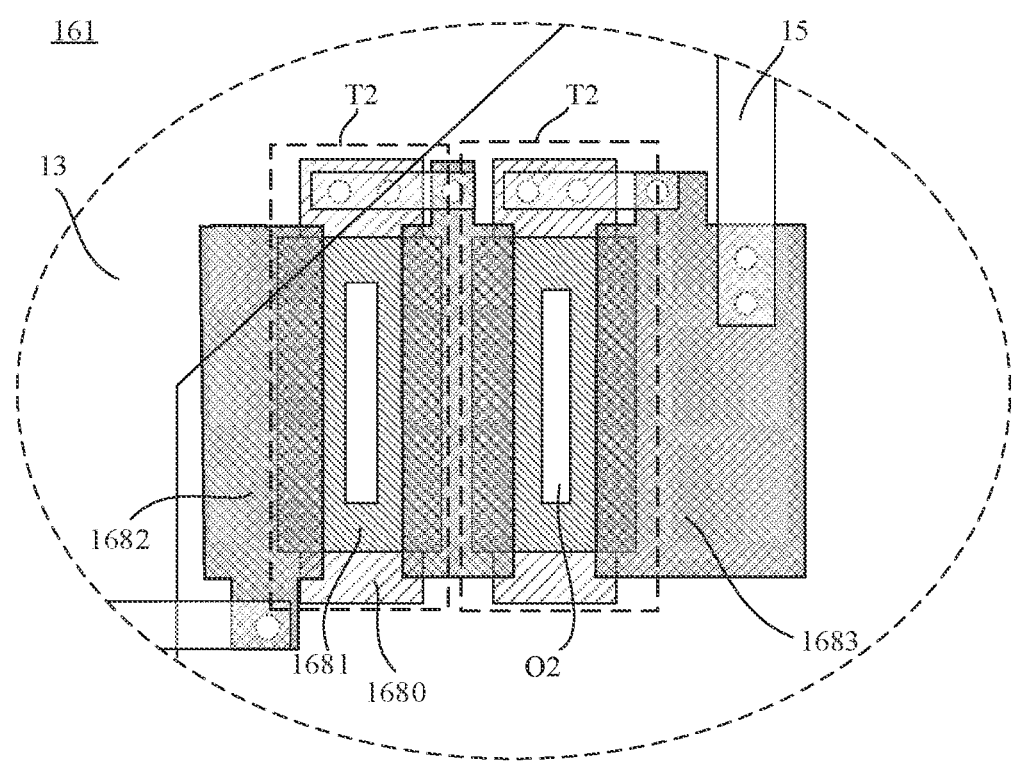
FIG. 9E is a schematic diagram of yet another switching unit, in accordance with some embodiments.
Figure 9F:
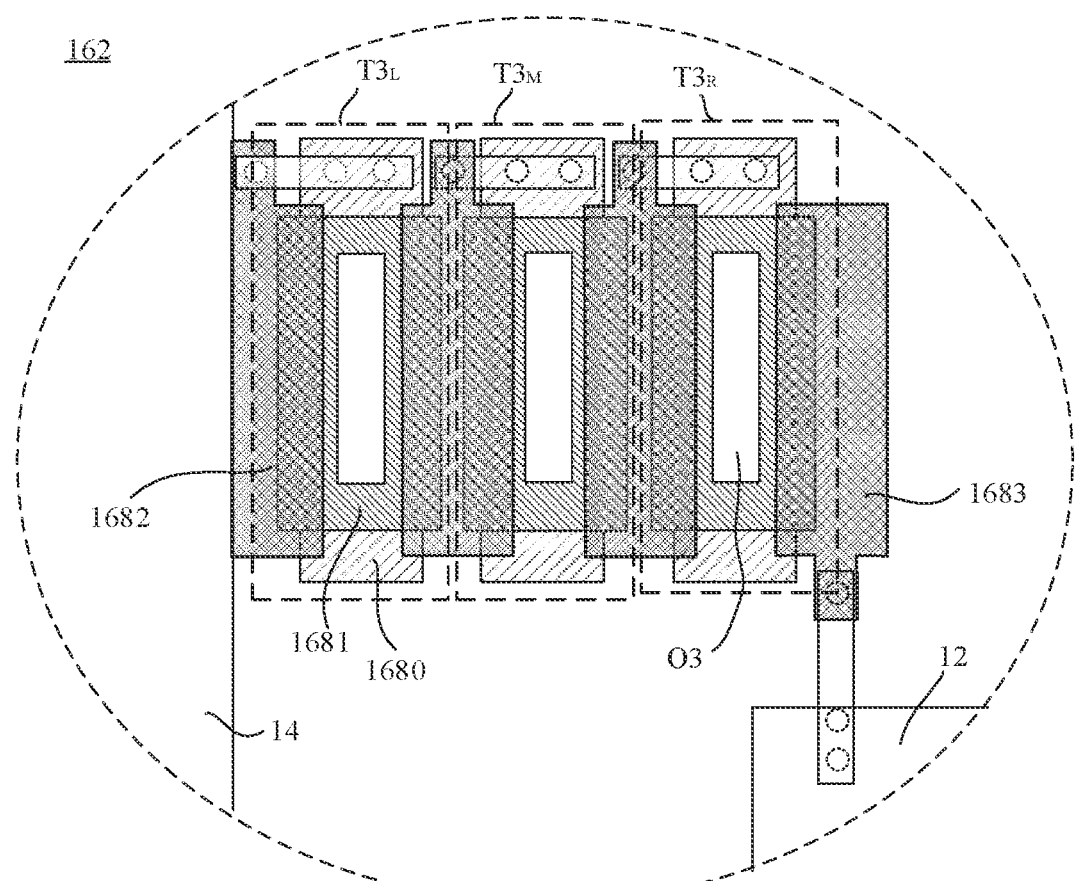
FIG. 9F is a schematic diagram of yet another switching unit, in accordance with some embodiments.

Referring to FIG. 9F, the film transistors included in the switching units will be illustrated by taking third thin film transistors T3 in the third switching unit 162 as an example. A source 1682 of each of the third thin film transistors T3 is connected to a corresponding gate 1680. For ease for description, in a direction from left to right in FIG. 9F, the third thin film transistors T3 in the third switching unit 162 are referred as a left thin film transistor $T3_L$, a middle thin film transistor $T3_M$ and a right thin film transistor $T3_R$. A gate 1680 of the left thin film transistor $T3_L$ is electrically connected to the first conductive pattern 14, a drain 1683 of the left thin film transistor T3 is electrically connected to a source 1682 of the middle thin film transistor T3, a drain 1683 of the middle thin film transistor $T3_M$ is electrically connected to a source 1682 of the right thin film transistor $T3_R$, and a drain 1683 of the right thin film transistor $T3_R$ is electrically connected to a first signal line 12 corresponding to the third switching unit 162.

On this basis, in some embodiments, referring to FIGS. 9C, 9E and 9F, the active layer 1681 of each of at least part of thin film transistors T included in the switching units is provided with an opening O, a length of the opening O is less than a length of an orthographic projection of the gate 1680 of the thin film transistor T on a plane where the active layer 1681 is located, and a width of the opening O is less than a width of the orthographic projection of the gate 1680 of the thin film transistor T on the plane where the active layer 1681 is located.

For example, referring to FIG. 9C, an active layer 1681 of each first thin film transistor T1 included in the first switching unit 160 is provided with a first opening O1. A length of the first opening O1 is less than a length of an orthographic projection of the gate 1680 of the first thin film transistor T1 on a plane where the active layer 1681 of the first thin film transistor T1 is located, and a width of the first opening O1 is less than a width of the orthographic projection of the gate 1680 of the first thin film transistor T1 on the plane.

For example, referring to FIG. 9E, an active layer 1681 of each second thin film transistor T2 included in the second switching unit 161 is provided with a second opening O2, and a length of the second opening O2 is less than a length of an orthographic projection of the gate 1680 of the second thin film transistor T2 on a plane where the active layer 1681 of the second thin film transistor T2 is located, and a width of the second opening O2 is less than a width of the orthographic projection of the gate 1680 of the second thin film transistor T2 on the plane.

For example, referring to FIG. 9F, the active layer 1681 of each third thin film transistor T3 included in the third switching unit 162 is provided with an third opening O3, and a length of the opening 1684 of the third thin film transistor T3 is less than a length of an orthographic projection of the gate 1680 of the third thin film transistor T3 on a plane where the active layer 1681 of the third thin film transistor T3 is located, and a width of the third opening O3 is less than a width of the orthographic projection of the gate 1680 of the third thin film transistor T3 on the plane.

In some embodiments, referring to FIGS. 9C, 9E and 9F, a shape of the opening O is rectangular.

A relationship between the numbers of thin film transistors included in the switching units will be exemplarily described below.

For example, as shown in FIG. 5C, the numbers of thin film transistors included in the first switching unit 160, the third switching unit 162 and the fifth switching unit 164 may all be equal. That is, the numbers of first thin film transistors T1, third thin film transistors T3 and fifth thin film transistors T5 are equal. The numbers of thin film transistors in the second switching unit 161, the fourth switching unit 163 and the sixth switching unit 165 may all be equal. That is, the numbers of second thin film transistors T2, fourth thin film transistors T4 and sixth thin film transistors T6 are equal.

For example, referring to FIG. 5C, the numbers of thin film transistors in the first switching unit 160, the third switching unit 162 and the fifth switching unit 164 are all three, and the numbers of thin film transistors in the second switching unit 161, the fourth switching unit 163 and the sixth switching unit 165 are two.

In this way, it is convenient to manufacture switching units electrically connected to the first conductive pattern 14 and/or the second conductive pattern 15, and the process is simple.

For example, as shown in FIG. 5D, the numbers of thin film transistors in the first switching unit 160 and in the fifth switching unit 164 are equal, and the numbers of thin film transistors in the second switching unit 161, in the third switching unit 162, in the fourth switching unit 163 and in the sixth switching unit 165 are equal.

For example, as shown in FIG. 5E, the numbers of thin film transistors in the first switching unit 160 and in the fifth switching unit 164 are equal, the numbers of thin film transistors in the second switching unit 161, in the third switching unit 162 and in the sixth switching unit 165 are equal, and the number of fourth thin film transistors T4 in the fourth switching unit 163 is one.

Figure 6A:
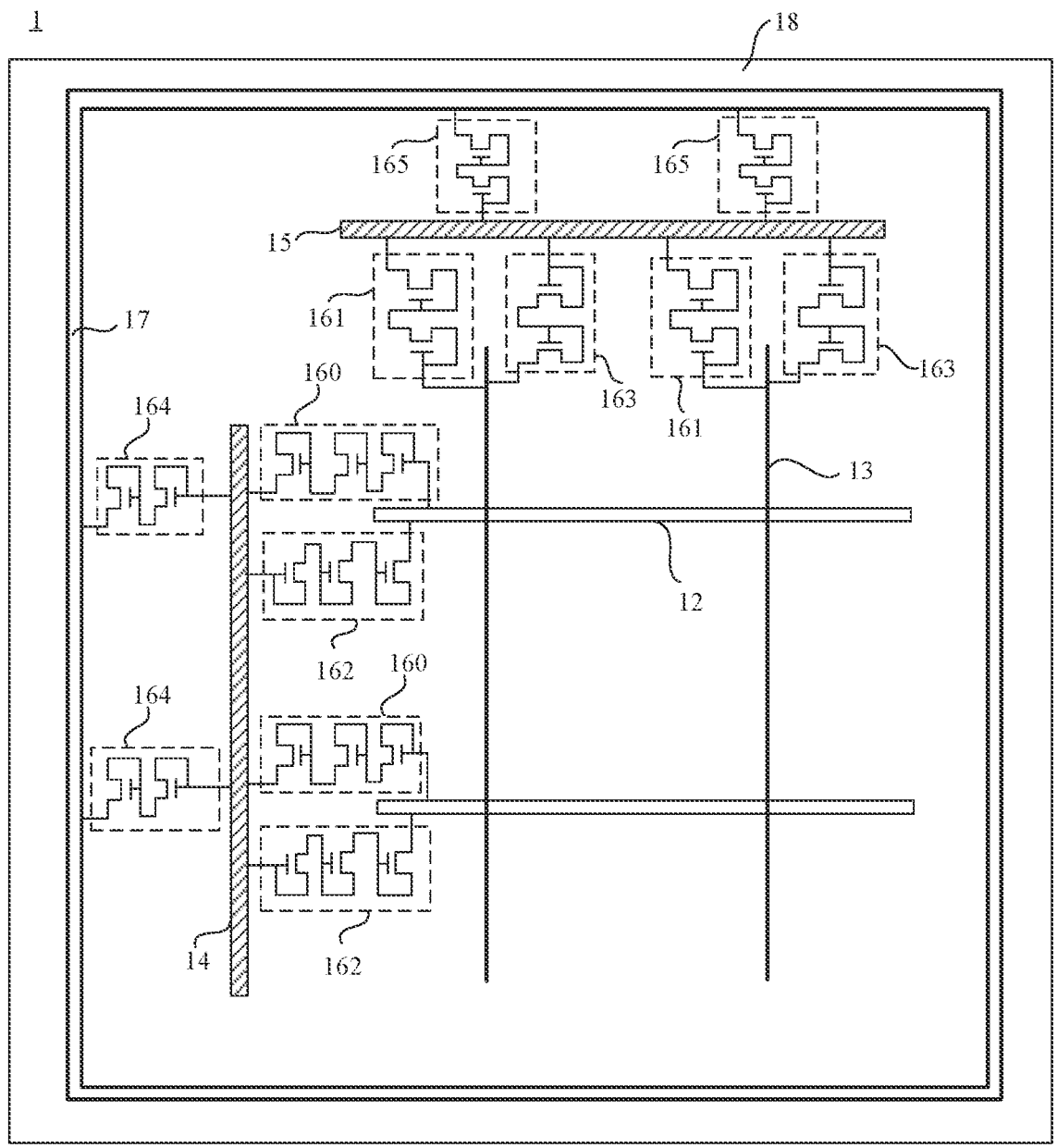
FIG. 6A is a schematic diagram of yet another display panel, in accordance with some embodiments.
Figure 6B:
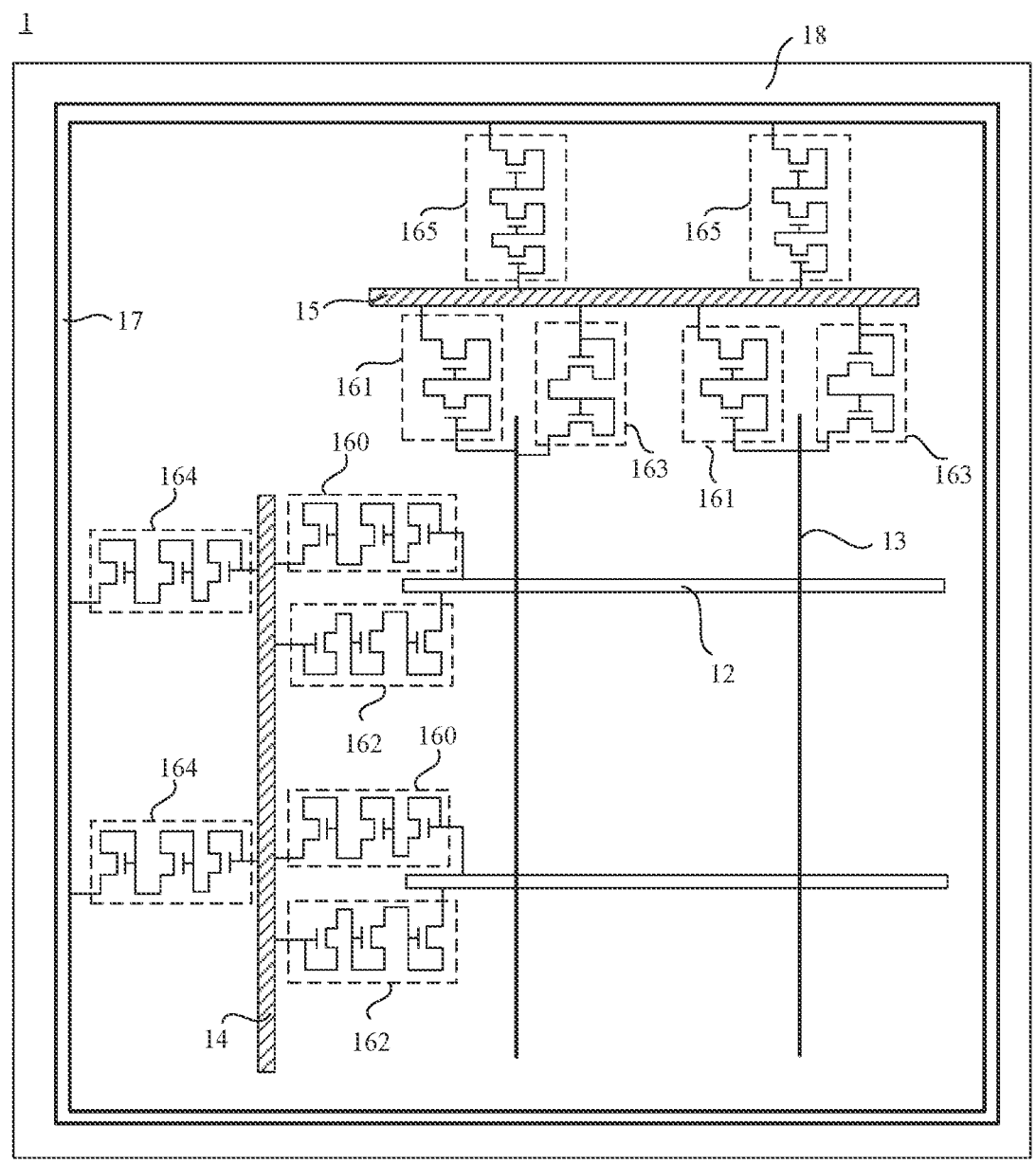
FIG. 6B is a schematic diagram of yet another display panel, in accordance with some embodiments.

For example, as shown in FIGS. 6A and 6B, the numbers of thin film transistors in the first switching unit 160 and in the third switching unit 162 are equal, the numbers of thin film transistors in the second switching unit 161 and in the fourth switching unit 163 are equal, and the numbers of thin film transistors in the first switching unit 160 and the fifth switching unit 164 are equal.

A relationship between the channel width-to-length ratios of the thin film transistors included in the switching units will be exemplarily described below.

For example, as shown in FIG. 5C, channel width-to-length ratios of the thin film transistors in the first switching unit 160, the third switching unit 162 and the fifth switching unit 164 are substantially equal. That is, channel width-to-length ratios of the first thin film transistor T1, the third thin film transistor T3 and the fifth thin film transistor T5 are substantially equal. Channel width-to-length ratios of the thin film transistors in the second switching unit 161, the fourth switching unit 163 and the sixth switching unit 165 are all substantially equal. That is, channel width-to-length ratios of the second thin film transistor T2, the fourth thin film transistor T4, and the sixth thin film transistor T6 are substantially equal. In this way, it is convenient to manufacture the switching units 16 electrically connected to the first conductive pattern 14 and the second conductive pattern 15.

For example, as shown in FIG. 5B, the width-to-length ratio of the first thin film transistor T1 in the first switching unit 160 is equal to the channel width-to-length ratio of the third thin film transistor T3 in the third switching unit 162. The channel width-to-length ratio of the second thin film transistor T2 in the second switching unit 161 is equal to the channel width-to-length ratio of the fourth thin film transistor T4 in the fourth switching unit 163.

The above descriptions are only specific implementations of the present disclosure, but the protection scope of the present disclosure is not limited thereto. Any person skilled in the art can readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A display panel, comprising a plurality of first signal lines, a plurality of second signal lines, at least one first conductive pattern, at least one second conductive pattern, a plurality of first switching units and a plurality of second switching units, an area of each first signal line being greater than an area of each second signal line, wherein
   each first signal line is electrically connected to at least one first conductive pattern through at least one first switching unit, each first switching unit is configured to close a line between a corresponding first signal line and a corresponding first conductive pattern, the first switching unit includes at least one first thin film transistor;
   each second signal line is electrically connected to at least one second conductive pattern through at least one second switching unit, each second switching unit is configured to close on a line between a corresponding second signal line and a corresponding second conductive pattern, and the second switching unit includes at least one second thin film transistor;
   a channel width-to-length ratio of each first thin film transistor is greater than a channel width-to-length ratio of each second thin film transistor; and
   the first signal lines are gate lines, and the second signal lines are data lines.

2. The display panel according to claim 1, wherein the first switching unit includes at least two first thin film transistors; and a number of the at least two first thin film transistors included in the first switching unit is greater than a number of the at least one second thin film transistor included in the second switching unit.

3. The display panel according to claim 2, wherein the first switching unit includes three first thin film transistors, and the second switching unit includes two second thin film transistors.

4. The display panel according to claim 1, wherein the first switching unit includes a plurality of first thin film transistors connected in series, and a channel width-to-length ratio of a first thin film transistor closest to the first signal line is greater than a channel width-to-length ratio of each remaining first thin film transistor; and/or
   the second switching unit includes a plurality of second thin film transistors connected in series, and a channel width-to-length ratio of a second thin film transistor closest to the second signal line is greater than a channel width-to-length ratio of each remaining second thin film transistor.

5. The display panel according to claim 1, wherein
   the first switching unit includes a plurality of first thin film transistors connected in series; a first electrode of a first thin film transistor closest to the corresponding first signal line is electrically connected to the corresponding first signal line, and a second electrode of another first thin film transistor closest to the corresponding first conductive pattern is electrically connected to the corresponding first conductive pattern; and a gate of each first thin film transistor is electrically connected to a first electrode thereof, or is a floating gate; and
   the second switching unit includes a plurality of second thin film transistors connected in series; a first electrode of a second thin film transistor closest to the corresponding second signal line is electrically connected to the corresponding second signal line, and a second electrode of another second thin film transistor closest to the corresponding second conductive pattern is electrically connected to the corresponding second conductive pattern; and a gate of each second thin film transistor is electrically connected to a first electrode thereof, or is a floating gate.

6. The display panel according to claim 5, wherein the gate of each first thin film transistor is electrically connected to the first electrode thereof; and the display panel further comprises a plurality of third switching units, and the first signal line is further electrically connected to the at least one first conductive pattern through at least one third switching unit; each third switching unit is configured to close a line between a corresponding first signal line and a corresponding first conductive pattern; and
   the third switching unit includes a plurality of third thin film transistors connected in series; a first electrode of a third thin film transistor closest to the corresponding first conductive pattern is electrically connected to the corresponding first conductive pattern, and a second electrode of another third thin film transistor closest to the corresponding first signal line is electrically connected to the corresponding first signal line; and a gate of each third thin film transistor is electrically connected to a first electrode thereof.

7. The display panel according to claim 6, wherein a number of the at least one third thin film transistor included in the third switching unit is equal to a number of the at least one first thin film transistor included in the first switching unit; and/or
   a channel width-to-length ratio of each third thin film transistor is substantially equal to the channel width-to-length ratio of each first thin film transistor.

8. The display panel according to claim 5, wherein the gate of each second thin film transistor is electrically connected to the first electrode thereof; and the display panel further comprises a plurality of fourth switching units, and the second signal line is further electrically connected to the at least one second conductive pattern through at least one fourth switching unit; each fourth switching unit is configured to close a line between a corresponding second signal line and a corresponding second conductive pattern; and the fourth switching unit includes a plurality of fourth thin film transistors connected in series; a first electrode of a fourth thin film transistor closest to the corresponding second conductive pattern is electrically connected to the corresponding second conductive pattern, and a second electrode of another fourth thin film transistor closest to the corresponding second signal line is electrically connected to the corresponding second signal line; and a gate of each fourth thin film transistor is electrically connected to a first electrode thereof.

9. The display panel according to claim 8, wherein a number of the at least one fourth thin film transistor included in the fourth switching unit is equal to a number of the at least one second thin film transistor included in the second switching unit; and/or a channel width-to-length ratio of each fourth thin film transistor is substantially equal to the channel width-to-length ratio of each second thin film transistor.

10. The display panel according to claim 5, further comprising a common electrode line, wherein the at least one first conductive pattern and the at least one second conductive pattern are electrically connected to the common electrode line.

11. The display panel according to claim 10, further comprising:

a plurality of fifth switching units, the corresponding first conductive pattern being electrically connected to the common electrode line through at least one fifth switching unit, wherein the fifth switching unit includes a plurality of fifth thin film transistors connected in series; a first electrode of a fifth thin film transistor closest to the corresponding first conductive pattern is electrically connected to the corresponding first conductive pattern, and a second electrode of another fifth thin film transistor closest to the common electrode line is electrically connected to the common electrode line; and a gate of each fifth thin film transistor is electrically connected to a first electrode thereof; and a plurality of sixth switching units, the corresponding second conductive pattern being electrically connected to the common electrode line through at least one sixth switching unit, wherein the sixth switching unit includes a plurality of sixth thin film transistors connected in series; a first electrode of a sixth thin film transistor closest to the corresponding second conductive pattern is electrically connected to the corresponding second conductive pattern, and a second electrode of another sixth thin film transistor closest to the common electrode line is electrically connected to the common electrode line; and a gate of each sixth thin film transistor is electrically connected to a first electrode thereof.

12. The display panel according to claim 11, wherein a number of at least one fifth thin film transistor included in the fifth switching unit is equal to a number of the at least one first thin film transistor included in the first switching unit;

and/or a number of at least one sixth thin film transistor included in the sixth switching unit is equal to a number of the at least one second thin film transistor included in the second switching unit.

13. The display panel according to claim 11, wherein a channel width-to-length ratio of each fifth thin film transistor is substantially equal to the channel width-to-length ratio of each first thin film transistor; and/or a channel width-to-length ratio of each sixth thin film transistor is substantially equal to the channel width-to-length ratio of each second thin film transistor.

14. The display panel according to claim 11, wherein a channel width-to-length ratio of each fifth thin film transistor is substantially equal to a channel width-to-length ratio of each sixth thin film transistor.

15. The display panel according to claim 1, wherein the at least one first conductive pattern includes one first conductive pattern, and the at least one second conductive pattern includes one second conductive pattern, the first signal line is electrically connected to the one first conductive pattern through one first switching unit, and the second signal line is electrically connected to the one second conductive pattern through one second switching unit.

16. The display panel according to claim 1, wherein the at least one first conductive pattern includes two first conductive patterns arranged at two opposite sides of the plurality of first signal lines, and the at least one second conductive pattern includes two second conductive patterns arranged at two opposite sides of the plurality of second signal lines, the first signal line is electrically connected to the two first conductive patterns through two first switching units, respectively; and/or the second signal line is electrically connected to the two second conductive patterns through two second switching units, respectively.

17. The display panel according to claim 1, wherein an active layer of each first thin film transistor is provided with a first opening; and a length of the first opening is less than a length of an orthographic projection of a gate of the first thin film transistor on a plane where the active layer of the first thin film transistor is located, and a width of the first opening is less than a width of the orthographic projection of the gate of the first thin film transistor on the plane where the active layer of the first thin film transistor is located; and/or an active layer of each second thin film transistor is provided with a second opening, a length of the second opening is less than a length of an orthographic projection of a gate of the second thin film transistor on a plane where the active layer of the second thin film transistor is located, and a width of the second opening is less than a width of the orthographic projection of the gate of the second thin film transistor on the plane where the active layer of the second thin film transistor is located.

18. A display device, wherein the display device comprises the display panel according to claim 1.

* * * * *